United States Patent
Okumura et al.

(10) Patent No.: US 7,094,620 B2
(45) Date of Patent: Aug. 22, 2006

(54) SEMICONDUCTOR DEVICE MANUFACTURING METHOD

(75) Inventors: Mika Okumura, Tokyo (JP); Makio Horikawa, Tokyo (JP); Kimitoshi Satou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/505,180

(22) PCT Filed: Jan. 29, 2003

(86) PCT No.: PCT/JP03/00859

§ 371 (c)(1), (2), (4) Date: Aug. 31, 2004

(87) PCT Pub. No.: WO2004/068591

PCT Pub. Date: Aug. 12, 2004

(65) Prior Publication Data

US 2005/0227477 A1    Oct. 13, 2005

(51) Int. Cl.
*H01L 21/00*    (2006.01)
*H01L 29/82*    (2006.01)

(52) U.S. Cl. .................. 438/48; 438/50; 438/52; 257/415; 257/417

(58) Field of Classification Search .................. None
See application file for complete search history.

(56) References Cited

U.S. PATENT DOCUMENTS 5,461,916 A    10/1995    Fujii et al.
5,922,212 A  *  7/1999    Kano et al. ............... 216/2
6,048,774 A  *  4/2000    Yamamoto et al. ...... 438/406

FOREIGN PATENT DOCUMENTS

| JP | 05-190690 | 7/1993 |
|----|-----------|--------|
| JP | 5-190690 | 7/1993 |
| JP | 8-274065 | 10/1996 |
| JP | 08-274066 | 10/1996 |
| JP | 2000-074768 | 3/2000 |
| JP | 2001-119040 | 4/2001 |
| JP | 2001-281264 | 10/2001 |
| JP | 2002-296038 | 10/2002 |
| WO | 91/12497 | 8/1991 |
| WO | 93/22690 | 11/1993 |

\* cited by examiner

*Primary Examiner*—Dung A. Le
(74) *Attorney, Agent, or Firm*—Oblon, Spivak, McClelland, Maier & Neustadt, P.C.

(57) ABSTRACT

A semiconductor device manufacturing method includes forming an insulating layer on a semiconductor substrate, forming, over the insulating layer, a first sacrificial layer having a first opening, and forming, on the sacrificial layer, a first electrode and a dummy body between the first electrode and the first opening. A photoresist is formed on the structure obtained by the previous steps, the photoresist having a second opening that opens inside the first opening. The insulating layer is etched using the photoresist as a mask to expose the semiconductor substrate, and a second electrode is formed in contact with the exposed semiconductor substrate. The sacrificial layer is removed.

16 Claims, 38 Drawing Sheets

FIG. 2
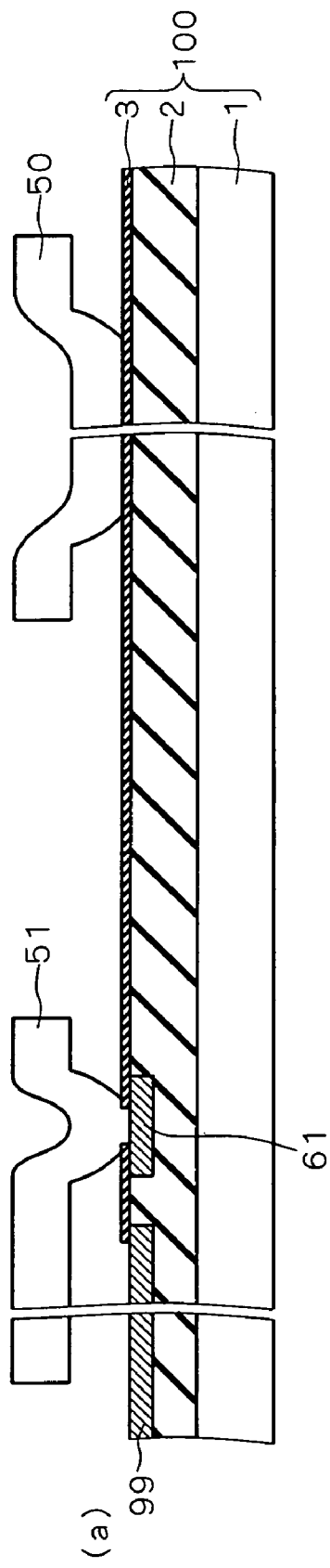
(a)
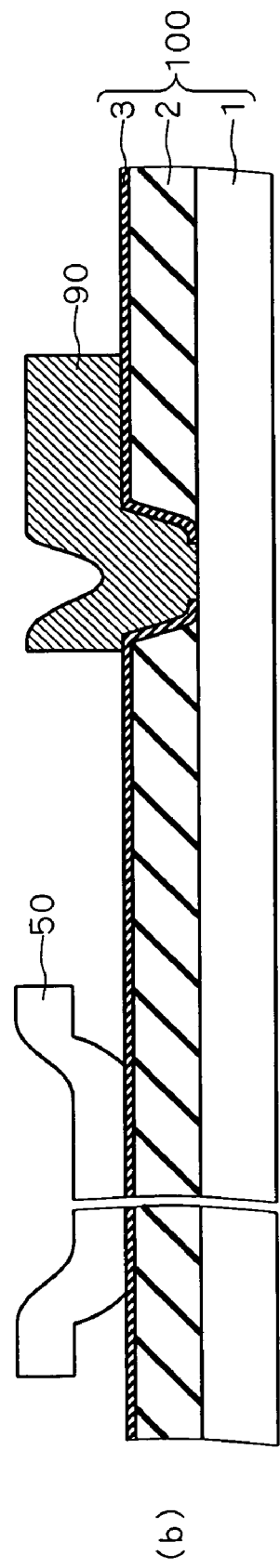
(b)

FIG. 3
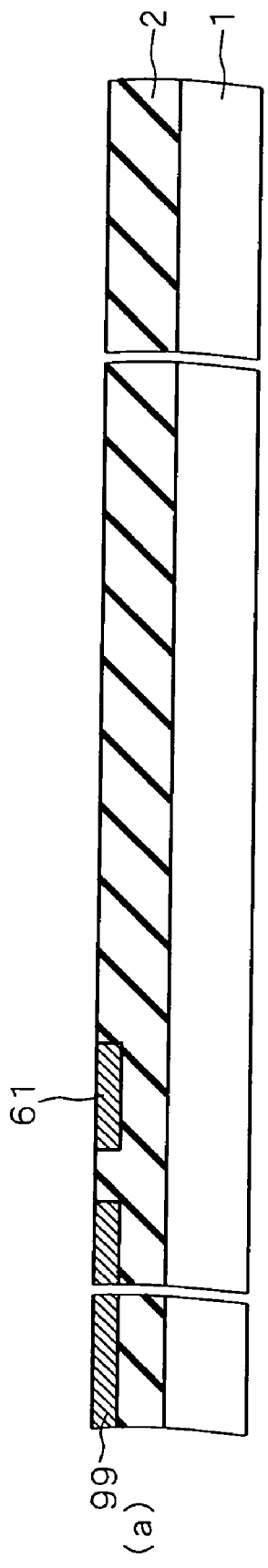
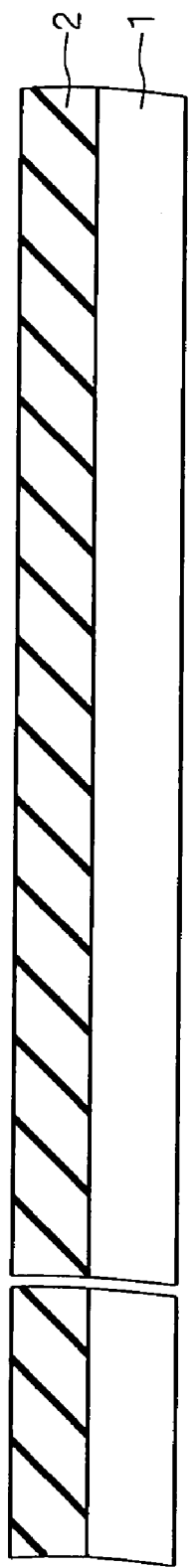

FIG. 4
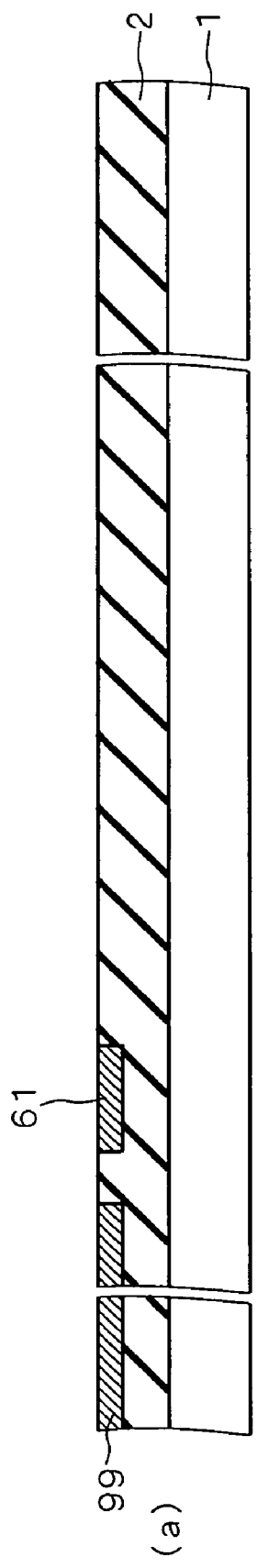
(a)
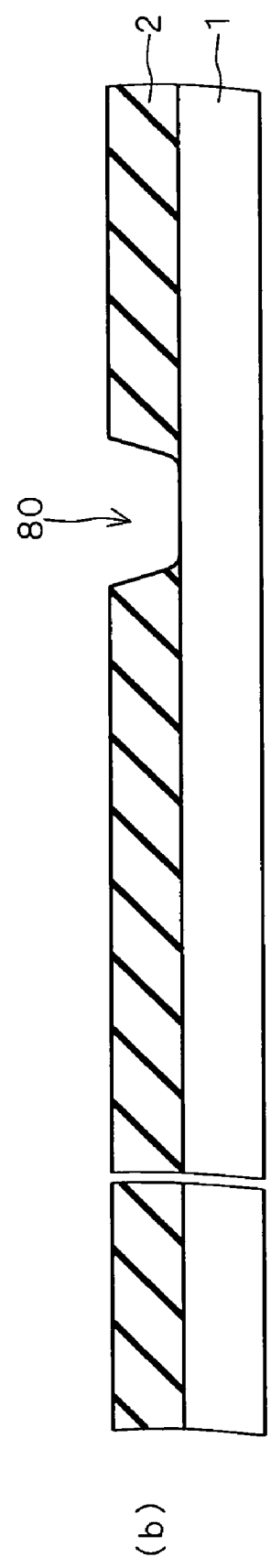
(b)

FIG. 6
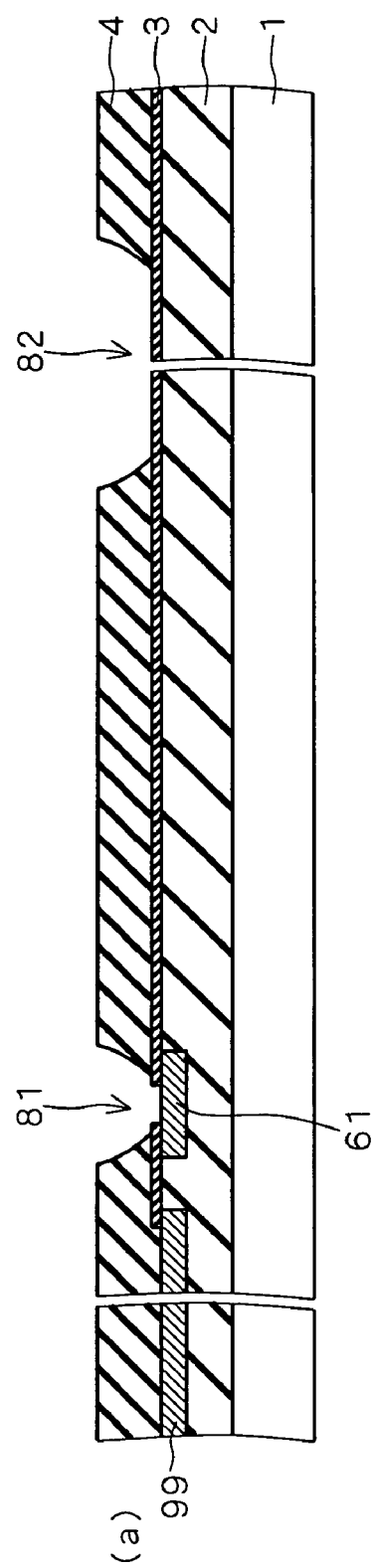
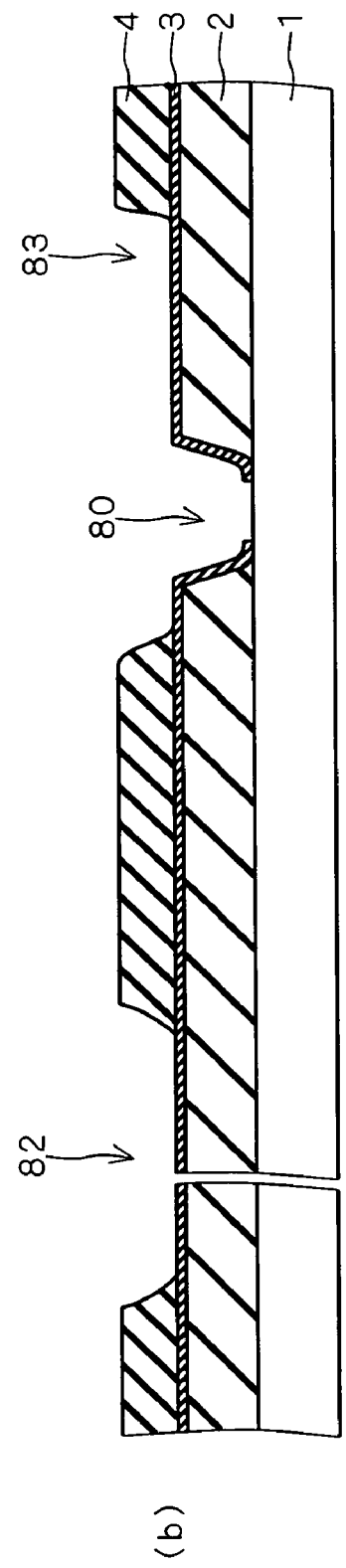

FIG. 9
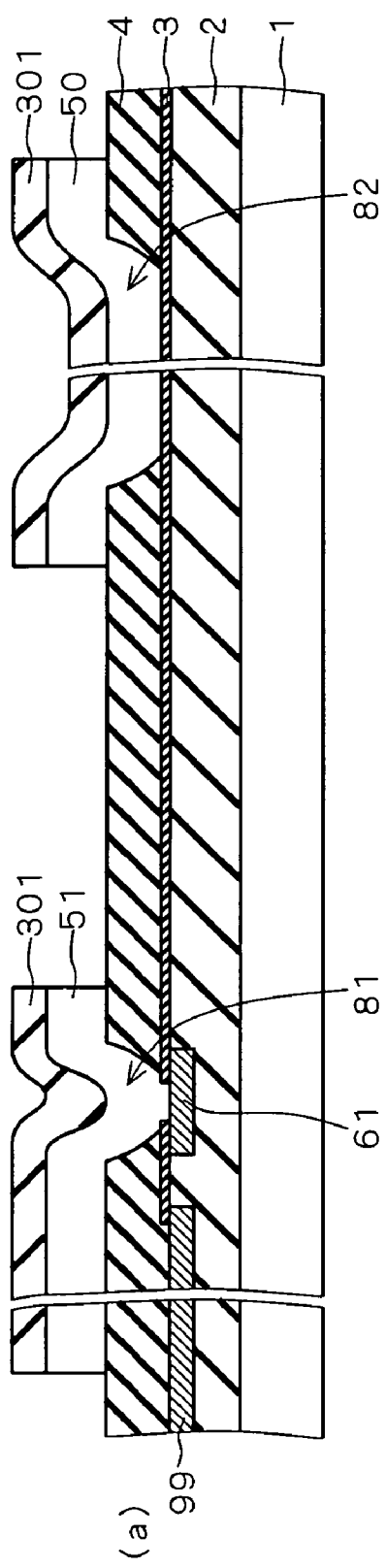
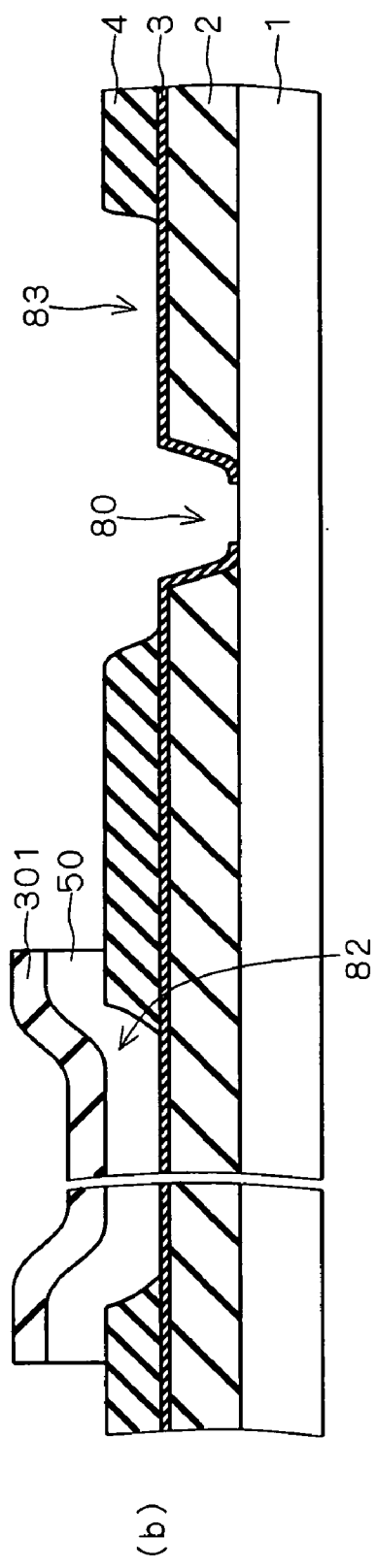

F I G. 1 2
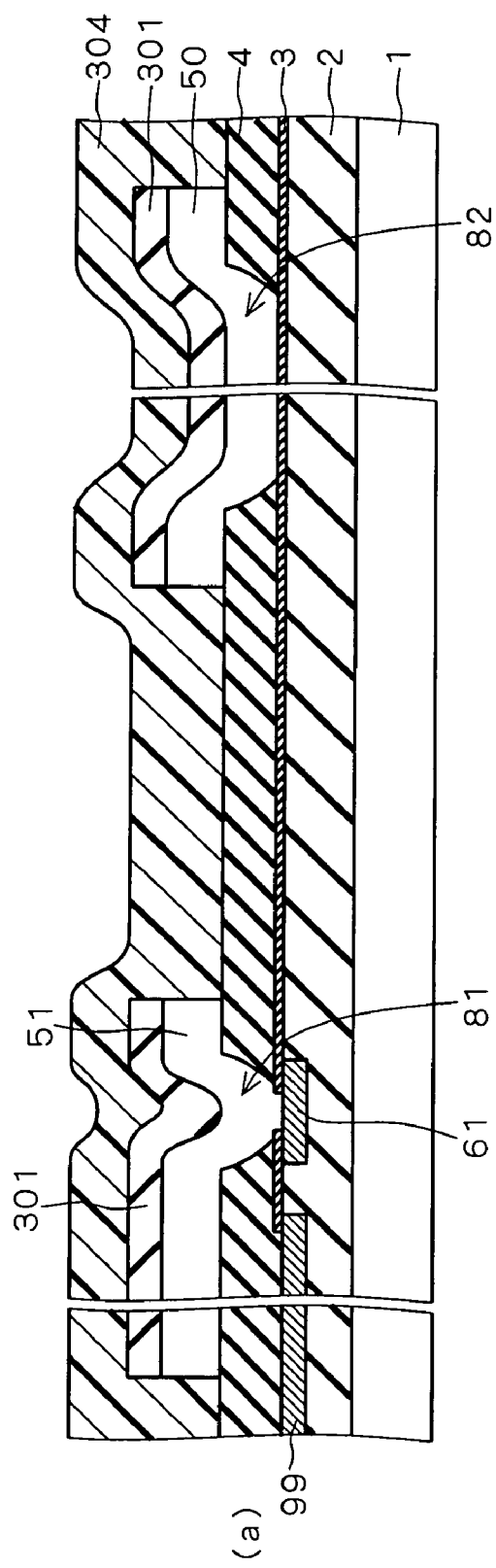
(a)
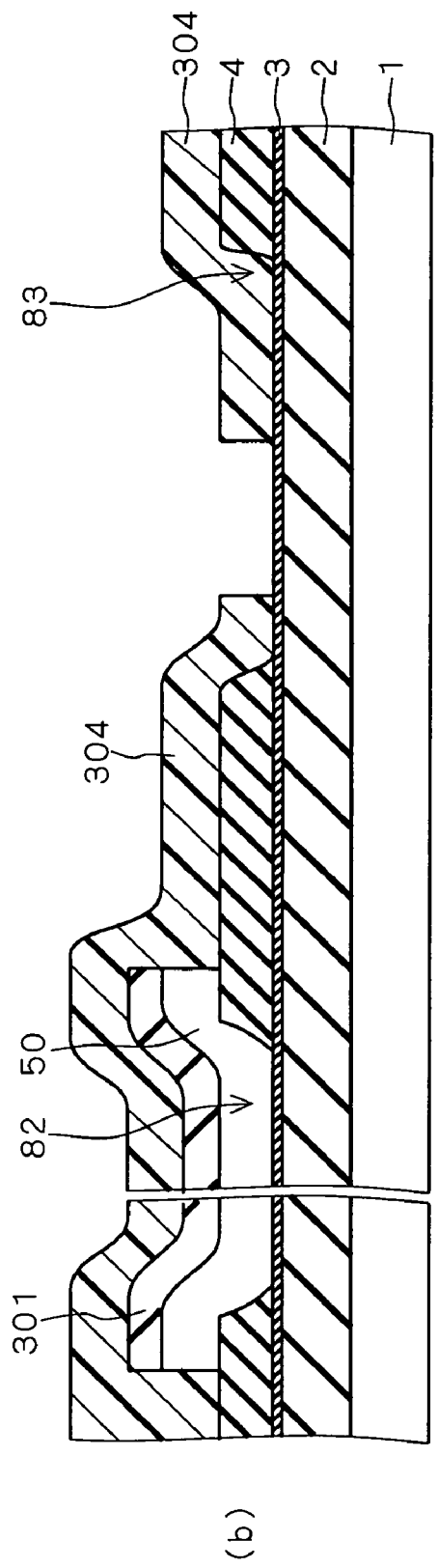
(b)

FIG. 15
(a)
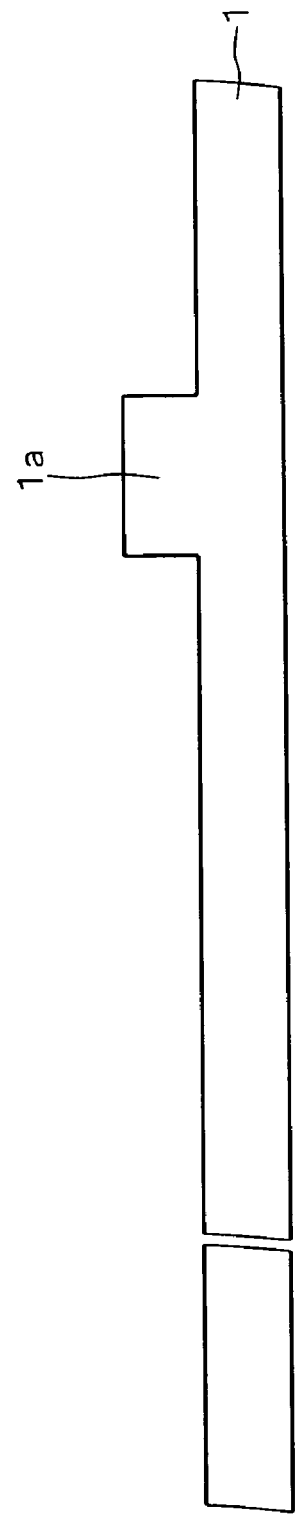
(b)

FIG. 19
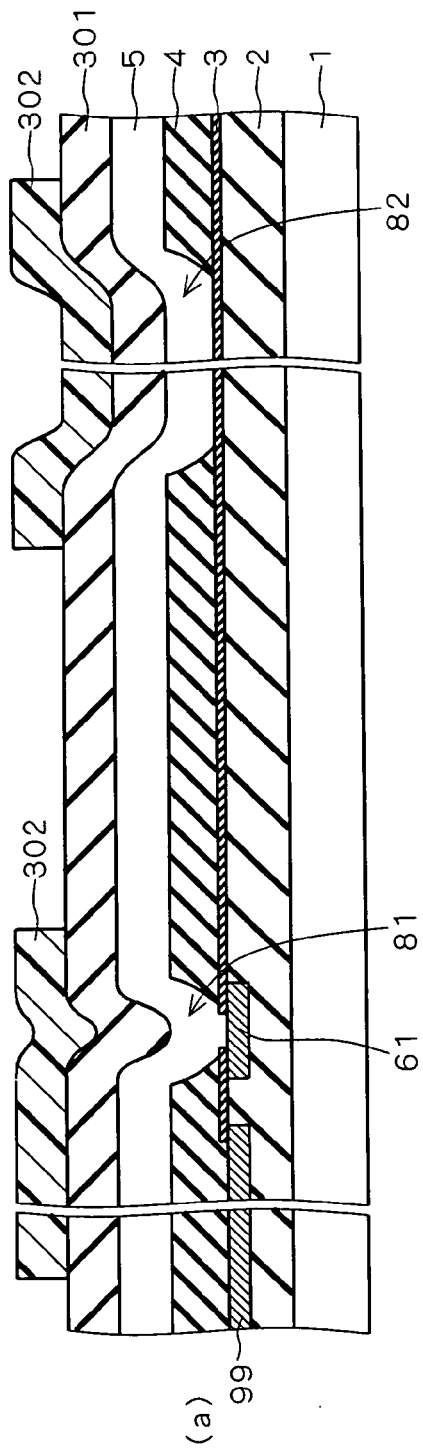
(a)
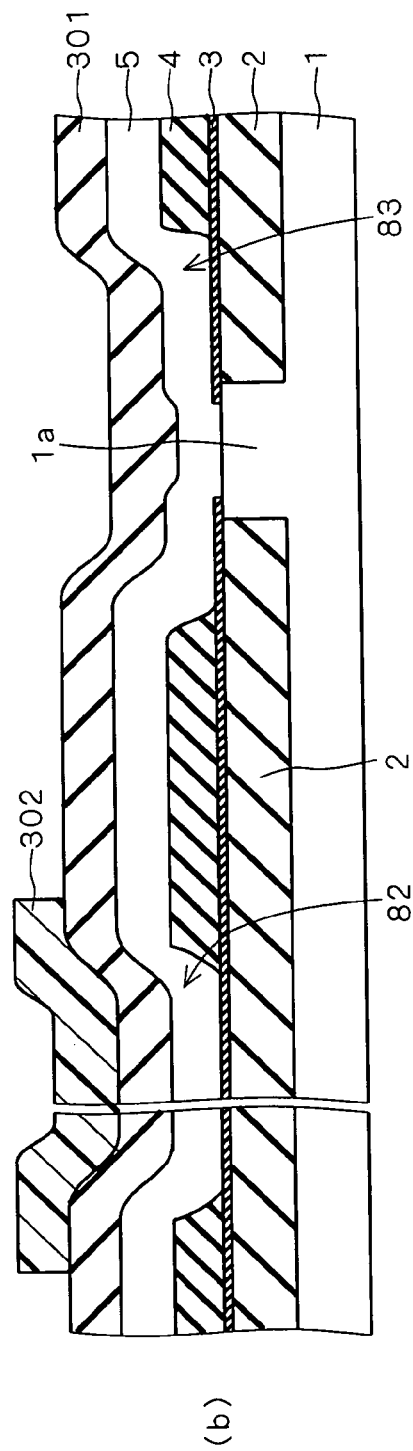
(b)

FIG. 23
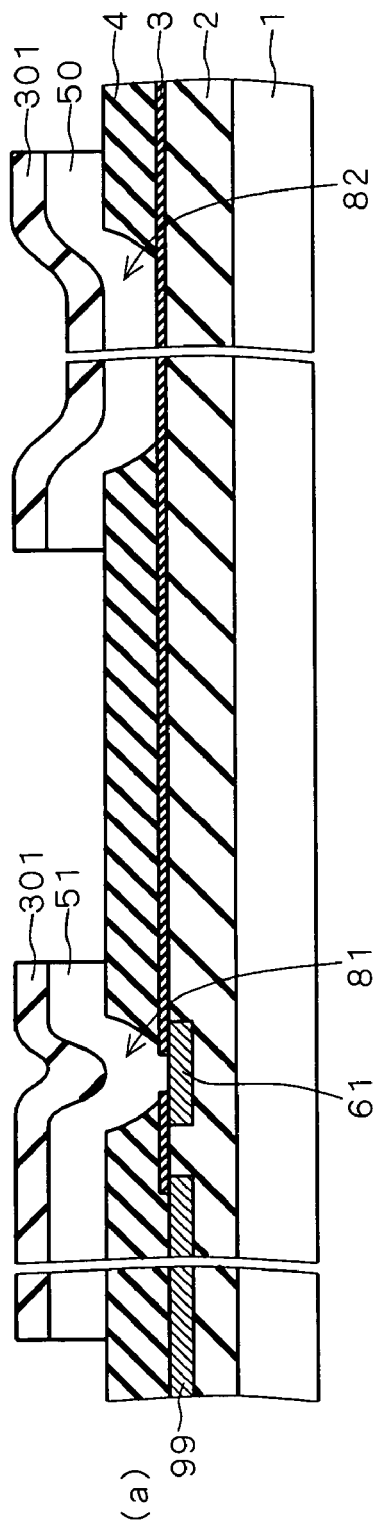
(a)
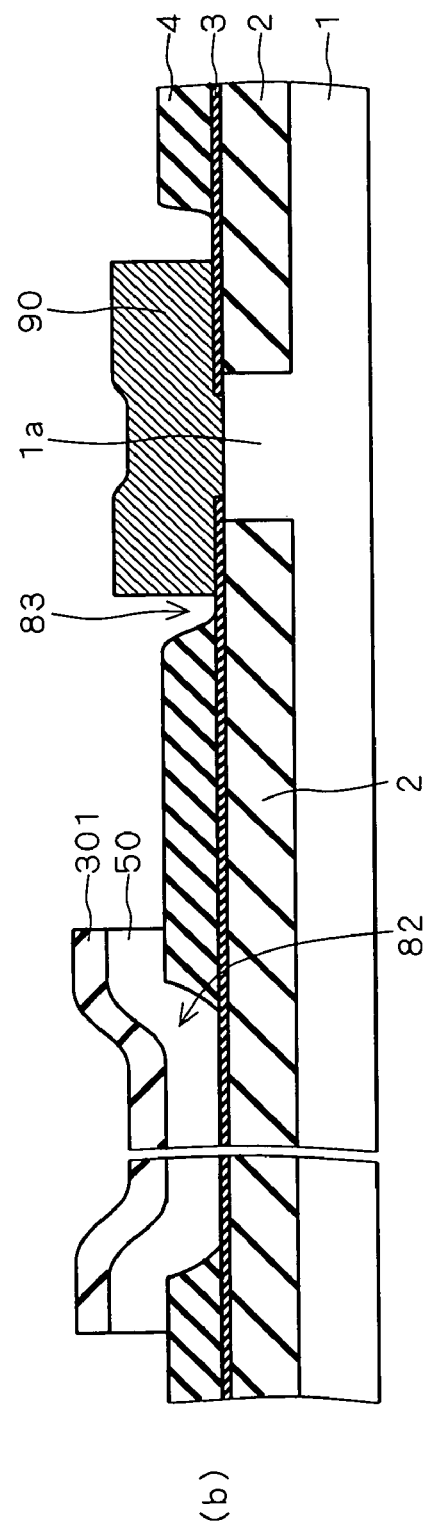
(b)

SEMICONDUCTOR DEVICE MANUFACTURING METHOD

This application is a 371 of PCT/JP03/00859 Jan. 29, 2003.

TECHNICAL FIELD

The present invention relates to photolithography techniques and can be applied to acceleration sensor having beam-structured movable portions, for example.

BACKGROUND ART

Patent Document 1 discloses an acceleration sensor having a beam-structured movable portion. The sensor element portion of the acceleration sensor has a movable electrode as part of the beam structure, first and second fixed electrodes, and a fixed electrode for canceling electrostatic force. The sensor element portion is covered and protected by a recessed portion of a cap substrate, with electrode extraction portions connected to the four electrodes through interconnections and not covered by the recess of the cap substrate.

The beam structure of an acceleration sensor is formed by previously forming a sacrificial layer for supporting it, forming and patterning a conductive layer (e.g. doped polysilicon) on it, and then removing the sacrificial layer. Therefore, when an opening for making contact with the silicon substrate on which the beam structure resides is formed alter the formation of the conductive layer by applying photolithography from the same side as the beam structure, it is necessary that the photoresist satisfactorily cover a step height approximately equal to the sum of the thickness of the conductive layer and the thickness of the sacrificial layer. Now, the conductive layer itself has a thickness of about 3.5 to 4.0 μm and the sacrificial layer has a thickness of about 2.0 to 2.5 μm, and thus the sum of the two exceeds 5 μm. It is therefore desirable to form the photoresist thick, in order to satisfactorily cover such a step height.

However, in general, forming photoresist thick is likely to cause cracks. Therefore, in order to form thick photoresist without causing cracks, it is desirable to apply the photoresist in a plurality of coating steps. Also, using a thick photoresist as a mask for etching incurs a reduction in etching rate, which necessitates an increased number of etching steps.

Patent Document 2 discloses a method for forming a contact hole having a tapered portion in its upper part. Patent Document 3 discloses a technique for improving the step coverage of metal interconnections, in which plural kinds of interlayer films are stacked and planarized and a tapered contact hole is formed by utilizing differences among etching rates of the films, so as to facilitate provision of an upper-layer metal interconnection.

Patent Document 1: Japanese Patent Application Laid-Open No. 2001-119040

Patent Document 2: Japanese Patent Application Laid-Open No. 8-274066 (1996)

Patent Document 3: Japanese Patent Application Laid-Open No. 5-190690 (1993)

DISCLOSURE OF THE INVENTION

An object of the present invention is to provide a technique for reducing a step height to be covered by photoresist during formation of an electrode connected to a semiconductor substrate, e.g. a silicon substrate on which an acceleration sensor resides.

A first semiconductor device manufacturing method of the invention includes the steps (a) to (i): the step (a) forms an interconnection (61) in a surface of an insulating layer (2) provided on a semiconductor substrate (1); the step (b) selectively removes said insulating layer to form a first opening (80) that exposes said semiconductor substrate; the step (c), performed after said step (b), forms, over said insulating layer, a sacrificial layer (4) having a second opening (81) that exposes a center portion of said interconnection and a third opening (83) that includes said first opening and is larger than said first opening; the step (d) forms a conductive semiconductor (5) all over the structure obtained in said step (c); the step (e) forms a first mask (301) on said conductive semiconductor; the step (f) etches said conductive semiconductor using said first mask to form a first electrode (51) connected to said interconnection; the step (g) forms a conductive film (9) all over the structure obtained in said step (f); the step (h) selectively removes said conductive film to form a second electrode (90) in contact with said semiconductor substrate in said first opening; and the step (i) removes said sacrificial layer.

According to the first semiconductor device manufacturing method of the invention, performing the step (b) prior to the step (d) eliminates the need to form thick photoresist as an etching mask for the first opening.

A second semiconductor device manufacturing method of the invention includes the steps (a) to (i); the step (a) forms an insulating layer (2) on a surface of a semiconductor substrate (1) having a locally projecting raised portion (1a), said insulating layer exposing said raised portion; the step (b) forms an interconnection (61) in a surface of said insulating layer (2); the step (c) forms, over said insulating layer, a sacrificial layer (4) having a first opening (81) that exposes a center portion of said interconnection and a second opening (83) that exposes a center portion of said raised portion; the step (d) forms a conductive semiconductor (5) all over the structure obtained in said step (c); the step (e) forms a first mask (301) on said conductive semiconductor; the step (f) etches said conductive semiconductor using said first mask to form a first electrode (51) connected to said interconnection; the step (g) forms a conductive film (9) all over the structure obtained in said step (f); the step (h) selectively removes said conductive film to form a second electrode (90) in contact with said raised portion; and the step (i) removes said sacrificial layer.

According to the second semiconductor device manufacturing method of the invention, no opening is formed to form the second electrode, so that thick photoresist is not required.

A third semiconductor device manufacturing method of the invention includes the steps (a) to (i): the step (a) forms an insulating layer (2) on a semiconductor substrate (1); the step (b) forms, over said insulating layer, a first sacrificial layer (4) having a first opening (83); the step (c) forms a first electrode (51, 53c) on said sacrificial layer; the step (d) forms a second sacrificial layer (11) all over the structure obtained in said step (c); the step (e) etches back at least said second sacrificial layer; the step (f) covers the structure obtained in said step (e) with a photoresist (305) having a second opening (86) that opens inside said first opening; the step (g) etches said second sacrificial layer using said photoresist as a mask; the step (h) forms a second electrode (90) in contact with said semiconductor substrate in an area opened in said step (g); and the step (i) removes said first sacrificial layer and said second sacrificial layer.

According to the third semiconductor device manufacturing method of the invention, the second sacrificial layer reduces surface undulations prior to the formation of the second electrode, which eliminates the need to form the photoresist thick.

A fourth semiconductor device manufacturing method of the invention includes the steps (a) to (g): the step (a) forms an insulating layer (2) on a semiconductor substrate (1); the step (b) forms, over said insulating layer, a first sacrificial layer (4) having a first opening (83); the step (c) forms, on said sacrificial layer, a first electrode (51, 53c) and a dummy body (54) between said first electrode and said first opening; the step (d) forms a photoresist (307) on the structure obtained in said step (c), said photoresist having a second opening (86) that opens inside said first opening; the step (e) etches said insulating layer using said photoresist as a mask to expose said semiconductor substrate; the step (f) forms a second electrode (90) in contact with said exposed semiconductor substrate; and the step (g) removes said sacrificial layer.

According to the fourth semiconductor device manufacturing method of the invention, the presence of the dummy body suppresses a reduction in photoresist film thickness in the first opening, which eliminates the need to form the photoresist thick.

A first acceleration sensor of the invention includes: a semiconductor substrate (1); an insulating layer (2); a fixed electrode (51); and a substrate electrode (90). Said semiconductor substrate has a raised portion (1a); said insulating layer (2) is provided on said semiconductor substrate and exposes a top surface of said raised portion; said fixed electrode (51) is provided above said insulating layer; and said substrate electrode is in contact with said semiconductor substrate on said top surface of said raised portion of said semiconductor substrate.

Manufacturing the first acceleration sensor of the invention does not require formation of an opening for forming the substrate electrode and therefore it does not require thick photoresist.

A second acceleration sensor of the invention includes a fixed electrode (51) and a movable electrode (53) and the distance between said fixed electrode (51) and said movable electrode (53) is 4 µm or less.

In the second acceleration sensor of the invention, the fixed electrode and movable electrode can be covered with good step coverage even with a thin film of photoresist.

These and other objects, features, aspects and advantages of the present invention will become more apparent from the following detailed description of the present invention and the accompanying drawings.

BRIEF DESCRIPTION OF THE DRAWINGS

FIGS. 2(a) and 2(b) are cross-sectional views respectively taken along line A—A and line B—B in FIG. 1.

FIGS. 3 to 11 are cross-sectional views showing a sequence of process steps for manufacturing the acceleration sensor of the first preferred embodiment.

FIG. 12 is a cross-sectional view used to describe an advantage of the first preferred embodiment of the invention.

FIGS. 15 to 23 are cross-sectional views showing a sequence of process steps for manufacturing the acceleration sensor of the second preferred embodiment.

BEST MODE FOR CARRYING OUT THE INVENTION

FIRST PREFERRED EMBODIMENT

Figure 1:
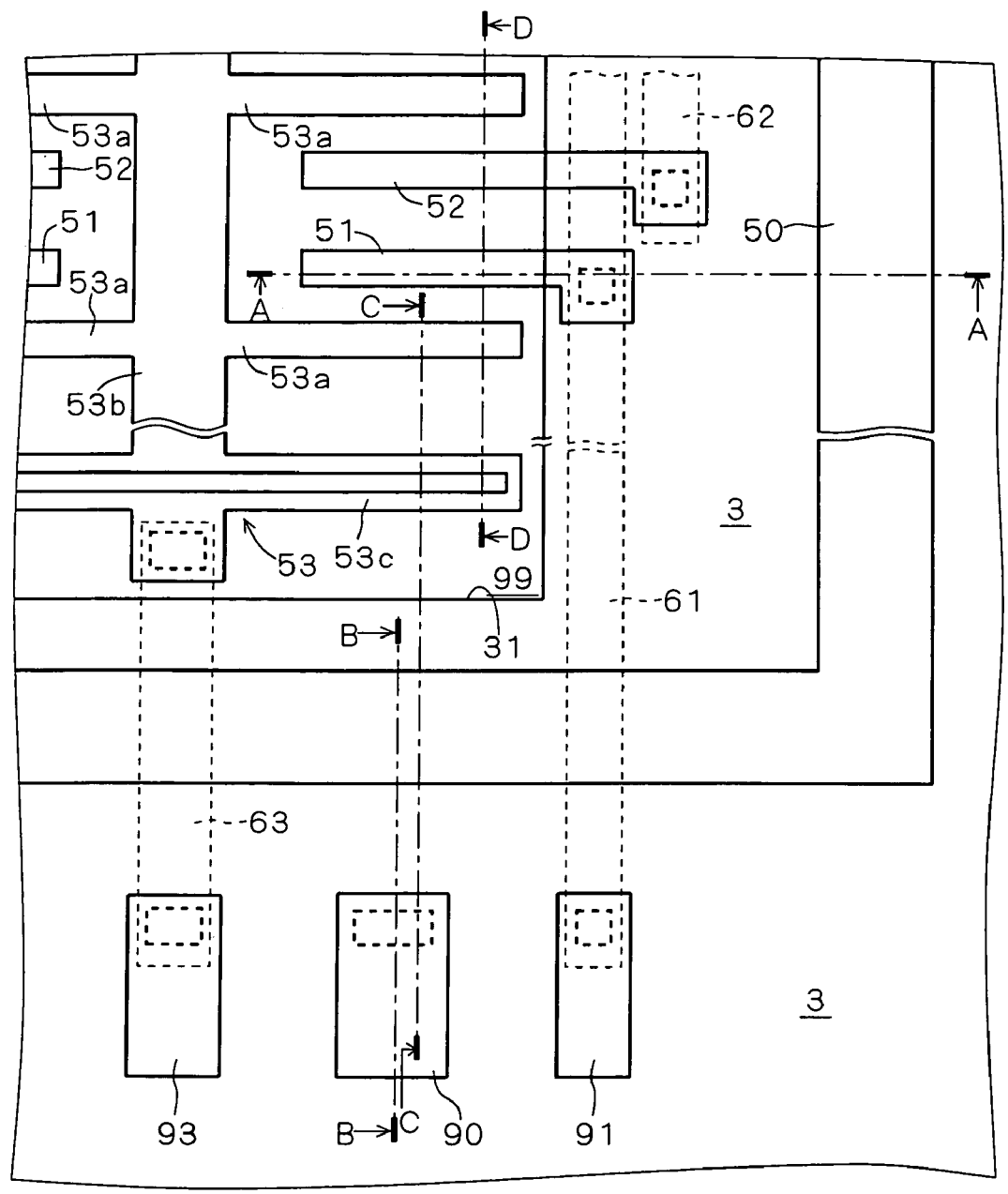
FIG. 1 is a plan view showing part of the structure of an acceleration sensor to which the manufacturing method of a first preferred embodiment of the invention can be applied.

FIG. 1 is a plan view showing part of the structure of an acceleration sensor to which the manufacturing method of a first preferred embodiment of the invention can be applied. FIGS. 2(a) and (b) respectively show the cross-sectional views taken along line A—A and line B—B in FIG. 1. A substrate 100 is formed of a semiconductor substrate 1 and an insulating layer 2 and an insulating film 3 provided thereon in this order. For example, silicon, silicon oxide, and silicon nitride are adopted respectively as the semiconductor substrate 1, insulating layer 2, and insulating film 3.

The insulating film 3 has an opening 31 that exposes a shield film 99, and a mass body 53 is provided in the opening 31. The mass body 53 has movable electrodes 53a, a rod 53b, and elastic portions 53c. The rod 53b has both its ends fixed on the substrate 100, and the other part of the rod 53b, excepting those ends, the movable electrodes 53a, and the elastic portions 53c are hanged at a distance from the insulating layer 2. Note that FIG. 1 only shows one end of the rod 53b. The movable electrodes 53a extend from the rod 53b between the two ends thereof like teeth of a comb in the transverse direction in the figure. While the elastic portions 53c, too, are disposed between the two ends of the rod 53b and extend from the rod 53b in the transverse direction in the figure, they return to the rod 53b, drawing hairpin bends. The elastic portions 53c are easily capable of elastic deformation in the longitudinal direction in the figure; therefore, when subjected to an external force, the rod 53b moves in the longitudinal direction in the figure, but when the external force disappears, it returns to the given position due to the resilience of the elastic portions 53c. Thus the elastic portions 53c move in the same way. Both ends of the rod 53b may be fixed on the substrate 100 outside the opening 31.

A plurality of fixed electrodes 51 and 52 are provided alternately in the longitudinal direction in the figure. One end of each is hanged in the opening 31 at a distance from the insulating layer 2. Those ends of the fixed electrodes 51 and 52 are alternately in mesh with the movable electrodes 53a at given intervals. The other ends of the fixed electrodes 51 and 52 are all fixed on the substrate 100 outside the opening 31. The fixed electrodes 51, 52 and mass body 53 are composed of polysilicon that is formed in the same photolithography process, for example.

For protection, the fixed electrodes 51 and 52 and mass body 53 are covered with a cap having a recess (not shown). In order to join the cap to the substrate 100, a semiconductor film 50 is provided on the insulating film 3 around the opening 31. When the cap is made of silicon, for example, the semiconductor film 50 is made of polysilicon that is formed in the same photolithography process with the fixed electrodes 51, 52 and mass body 53.

The fixed electrodes 51 are connected to each other through an interconnection 61 and the fixed electrodes 52 are connected to each other through an interconnection 62. The movable electrodes 53a are connected to an interconnection 63 through the rod 53b. The interconnections 61, 62 and shield film 99 are formed on the upper side of the insulating layer 2 (on the side that is in contact with the insulating film 3). For example, they are formed of polysilicon in the same photolithography process. The insulating film 3 exposes the interconnections 61 and 62. The fixed electrodes 51 and 52 do not move even when subjected to an external force. It is thus possible to know the magnitude of the external force on the basis of the electrostatic capacity occurring between the fixed electrodes 51 and movable electrodes 53a and the electrostatic capacity occurring between the fixed electrodes 52 and movable electrodes 53a.

In order to externally detect the electrostatic capacities, the interconnections 61 and 63 are further connected respectively to external electrodes 91 and 93 that are placed on the side opposite to the opening 31 with the semiconductor film 50 therebetween. Likewise, the interconnection 62 is connected to an external electrode (not shown) placed on the side opposite to the opening 31 with the semiconductor film 50 therebetween.

Also, an electrode 90, connected to the semiconductor 1, is provided on the opposite side to the opening 31 with the semiconductor film 50. The electrode 90 has a function to measure, or externally determine, the potential of the semiconductor substrate 1. For example, it functions as a substrate electrode of the acceleration sensor.

Next, a sequence of process steps for manufacturing the acceleration sensor having the structure above is described referring to FIGS. 3 to 11. Note that the figures denoted by (a) and (b) in each diagram respectively show cross-sectional views taken along lines A—A and B—B in FIG. 1.

First, as shown in FIG. 3, an insulating layer 2 is formed on a semiconductor substrate 1. Then the surface portions of the insulating layer 2 where the interconnection 61 and shield film 99 are to be formed are removed by etching; the interconnection 61 and shield film 99 are then formed. The surfaces of the interconnection 61 and shield film 99 are nearly level with the surface of the insulating layer 2. Though not shown in FIG. 3, the interconnections 62 and 63 are formed in the similar manner to the interconnection 61 and shield film 99.

Next, as shown in FIG. 4, the insulating layer 2 is selectively removed to form an opening 80 that exposes the semiconductor substrate 1. The electrode 90 connected to the semiconductor substrate 1 in the opening 80 is formed later. In the structure shown in FIG. 4, the surfaces of the insulating layer 2, interconnection 61, and shield film 99 are almost flat. Though not shown in FIG. 4, the surfaces of interconnections 62 and 63 are nearly level with the surface of the insulating layer 2. Therefore, even a thin photoresist, serving as an etching mask for formation of the opening 80, can satisfactorily cover their surfaces. In order to avoid cracks that are likely to occur when photoresist is formed thick, it is desirable to apply the photoresist in a plurality of coating steps. The photoresist used as an etching mask for formation of the opening 80 does not have to be applied in plural coating steps. Furthermore, it is possible to avoid a reduction in etching rate which is likely to occur when a thick photoresist is used as the etching mask.

Figure 5:
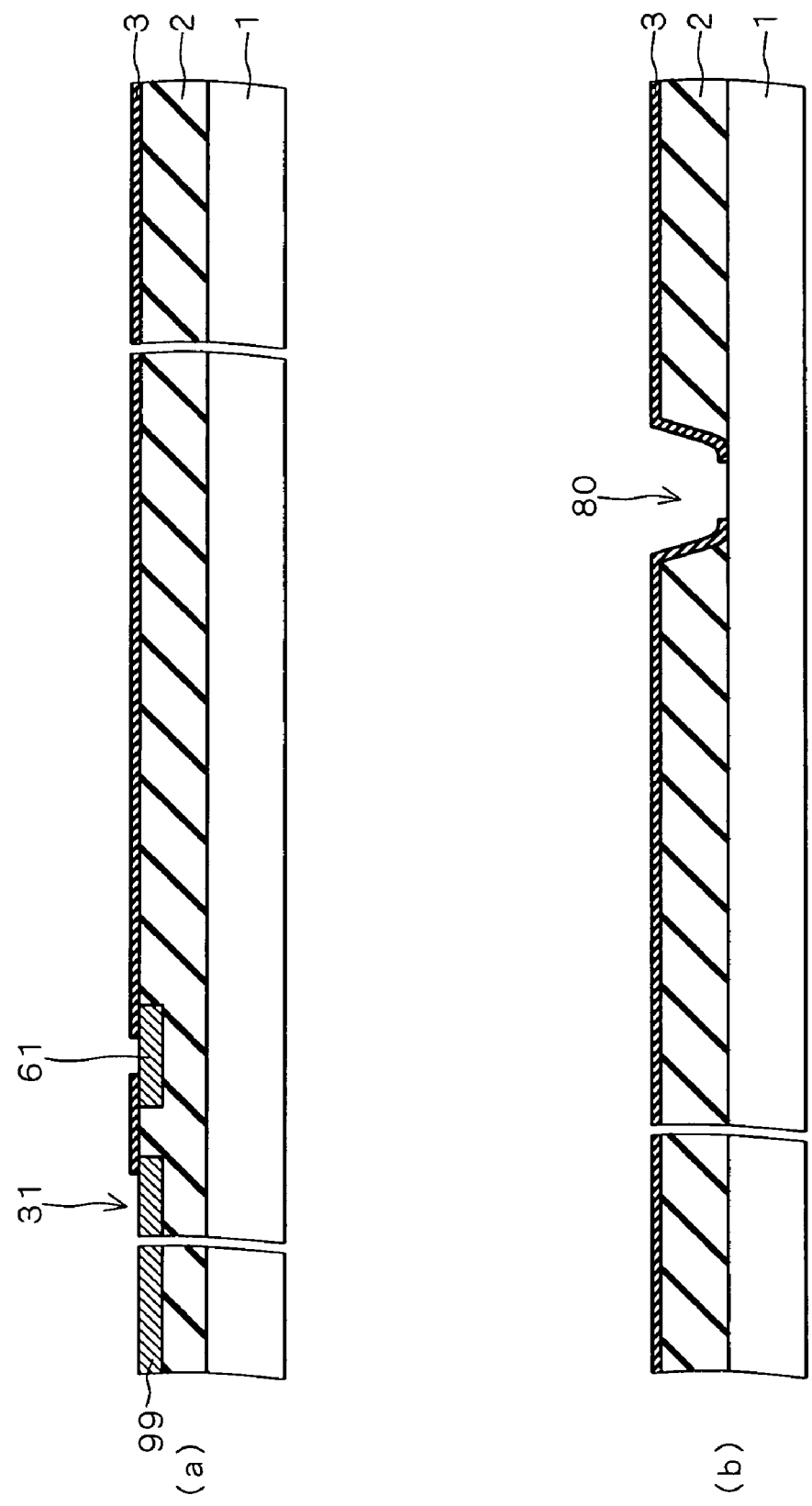

Next, as shown in FIG. 5, the insulating film 3 is selectively formed on the upper side of the structure shown in FIG. 4 (i.e. on the opposite side to the semiconductor substrate 1). The insulating layer 3 selectively covers the insulating layer 2. More specifically, while the insulating film 3 yet covers the edge surfaces of the insulating layer 2 exposed in the opening 80, it exposes a center portion of the top surface of the interconnection 61 (hereinafter, a center portion of the top surface of the interconnection 61 or any other component is referred to simply as a "center portion") and it also exposes a center portion of the semiconductor substrate 1 in the opening 80. The insulating film 3 also has the opening 31 that exposes the shield film 99. The insulating film 3 is formed all over the surface of the structure of FIG. 4 and then selectively removed by etching using a photoresist as an etching mask, so as to obtain the structure shown in FIG. 5. The step height to be covered by the photoresist serving as the etching mask is about the film thickness of the insulating layer 2, so that it is not necessary to apply the photoresist in a plurality of coating steps, and no reduction in etching rate is caused. The insulating film 3 is formed to cover the edges of the interconnection 61 and the edge portions of the semiconductor substrate 1 in the opening 80 in order to prevent invasion of an etchant that is used to etch a sacrificial layer described later, and hence to prevent the insulating layer 2 from being etched.

Next, as shown in FIG. 6, a sacrificial layer 4 is selectively formed on the upper side of the structure shown in FIG. 5. More specifically, the sacrificial layer 4 has an opening 81 formed over the interconnection 61 to expose the edges of the insulating film 3 and the center portion of the interconnection 61 (and similarly, over the interconnections 62 and 63, though not shown in FIG. 6), an opening 82 that exposes the insulating film 3 in the area where the semiconductor film 50 will be formed in a following process, and an opening 83 that exposes the insulating film 3 in an area including the opening 80 and larger than that.

The sacrificial layer 4 is formed all over the surface of the structure shown in FIG. 5 and then selectively removed by etching using photoresist as an etching mask, so as to obtain the structure shown in FIG. 6. Since the step height to be covered by the photoresist serving as the etching mask is only approximately equal to the film thickness of the insulating layer 2, it is not necessary to apply the photoresist in plural application steps, and no reduction in etching rate is incurred.

Figure 7:
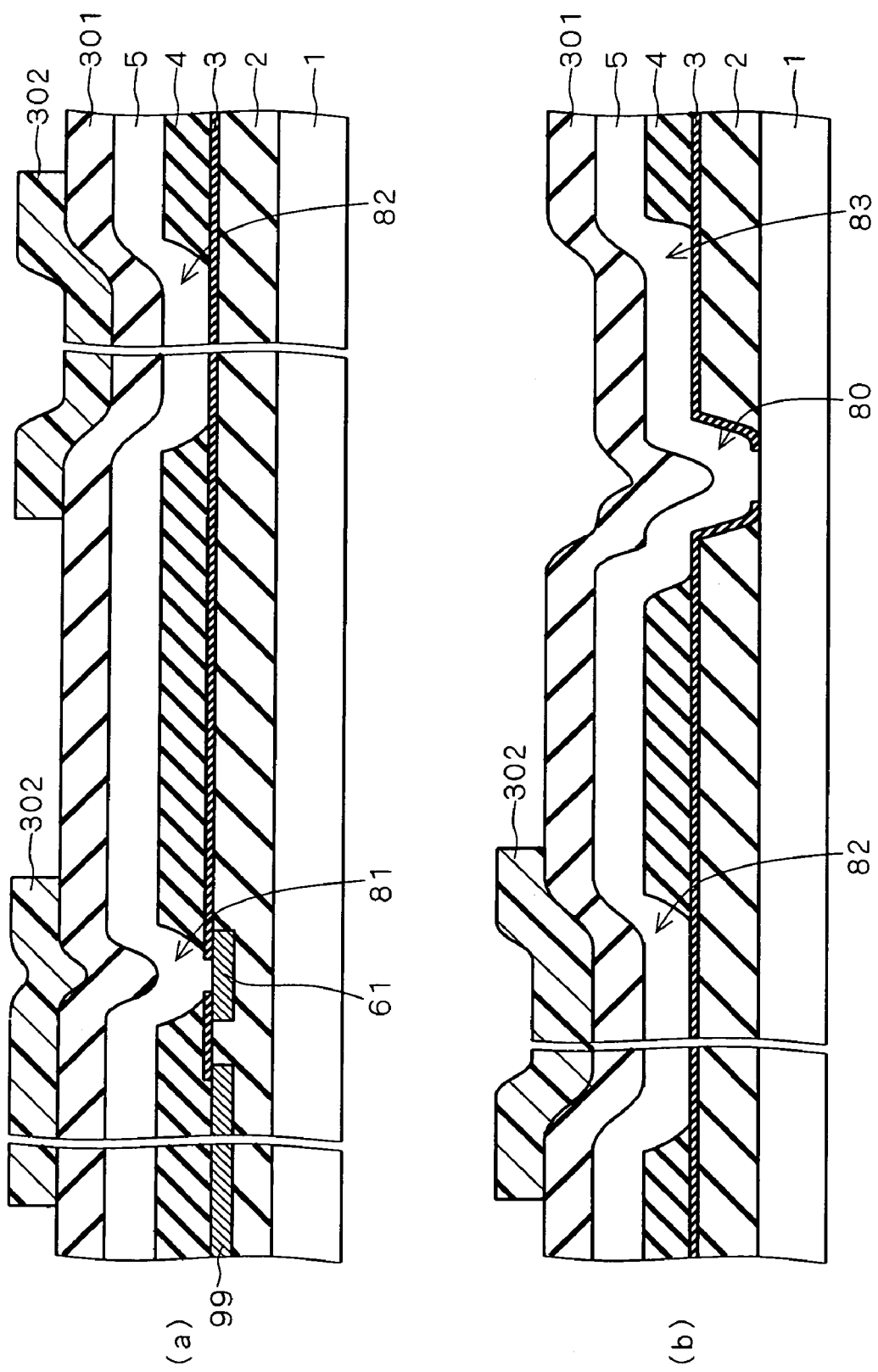
Figure 8:
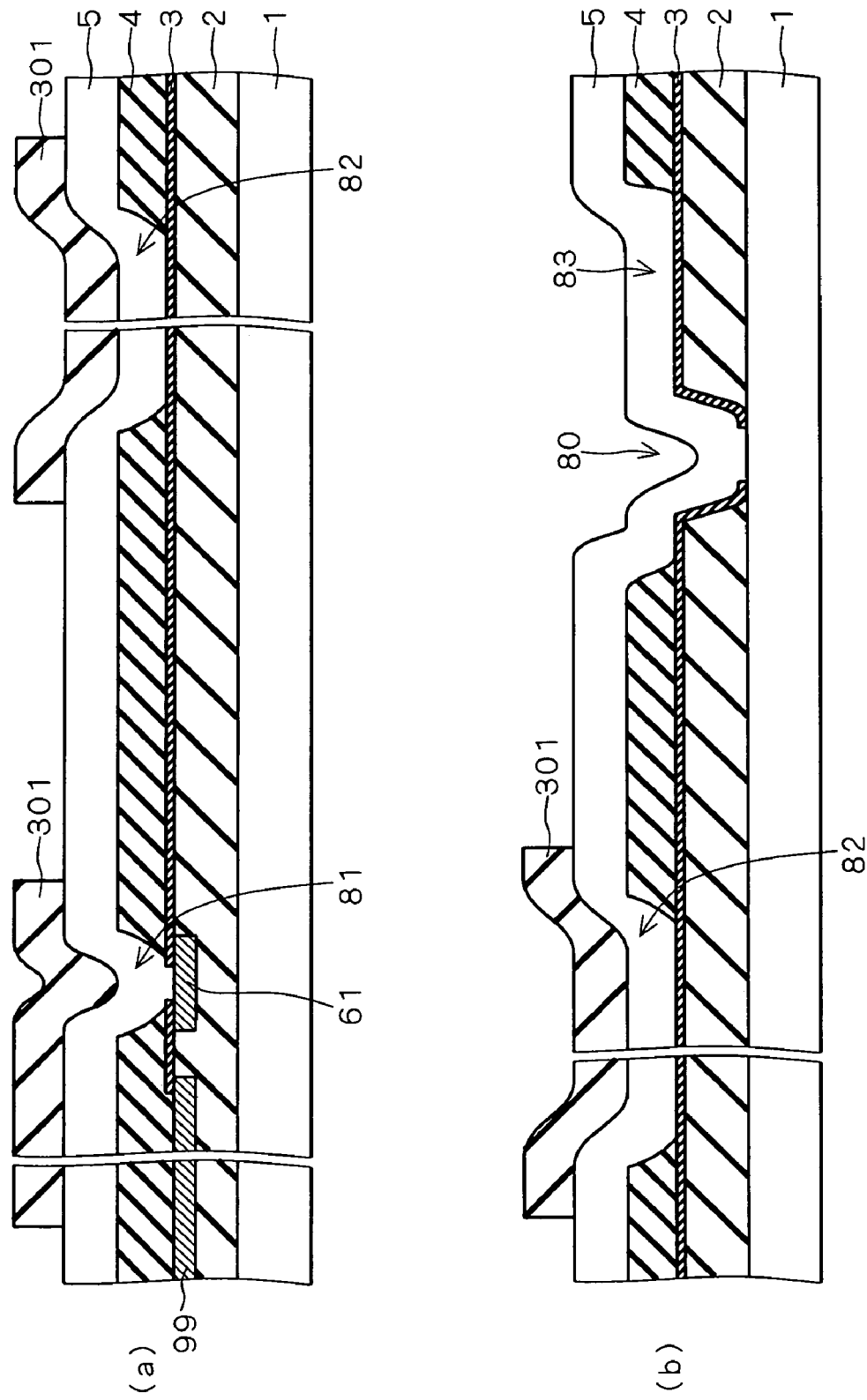

Next, as shown in FIG. 7, a doped polysilicon film 5 and a silicon oxide film 301 formed of TEOS (Tetra Ethyle Ortho Silicate: the film is referred to as "TEOS film" hereinafter) are stacked in this order on the upper side of the structure shown in FIG. 6. Then a photoresist 302 is applied on the TEOS film 301 and patterned so that the photoresist 302 remains in the areas where the semiconductor film 50, fixed electrodes 51, 52 and mass body 53 are to be formed. In the vicinity of the opening 80, the step height to be covered by the photoresist 302 is approximately equal to the sum of the film thickness of the insulating layer 2 and that of the sacrificial layer 4. However, the step height to be covered by the portions of the photoresist 302 that should remain is only approximately equal to the film thickness of the sacrificial layer 4, and so following process steps are not adversely affected even if the step coverage in the vicinity of the opening 80 is poor. Therefore the photoresist 302 can be formed thin. Next, using the photoresist 302 as an etching mask, the TEOS film 301 is etched and patterned (FIG. 8).

Next, using the remaining portions of the TEOS film 301 as hard mask, the doped polysilicon film 5 is etched to form the semiconductor film 50 and fixed electrode 51 as shown in FIG. 9. This etching may possibly reduce the film thickness of the TEOS film 301 to about 60%, for example. Though not shown in FIG. 9, the fixed electrodes 52 and mass body 53 are formed in the same way. In the opening 83, the insulating film 3 is exposed and the semiconductor substrate 1 is exposed from it.

Figure 10:
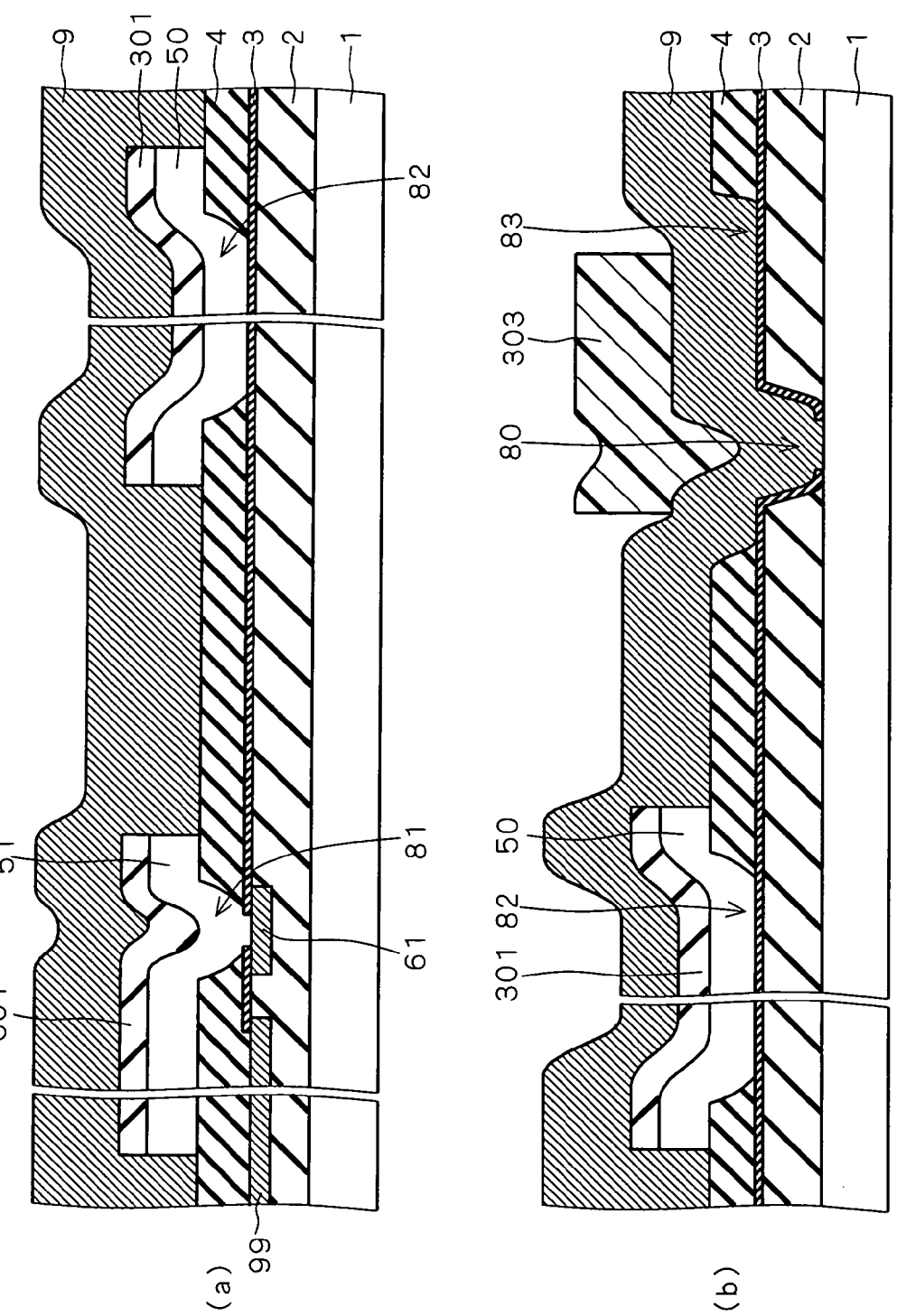

Next, as shown in FIG. 10, a metal film 9 is formed all over the structure shown in FIG. 9. An Al alloy that contains silicon is adopted as the metal film 9, for example. In the area for formation of the electrode 90, a patterned photoresist 303 covers the metal film 9. It does not have to be formed over the sacrificial layer 4, since the electrode 90 is to remain only in the opening 83. Therefore the step height to be covered by the photoresist 303 is only approximately equal to the film thickness of the insulating layer 2, which avoids the need to apply the photoresist in plural coating steps and also avoids a reduction in etching rate.

Figure 11:
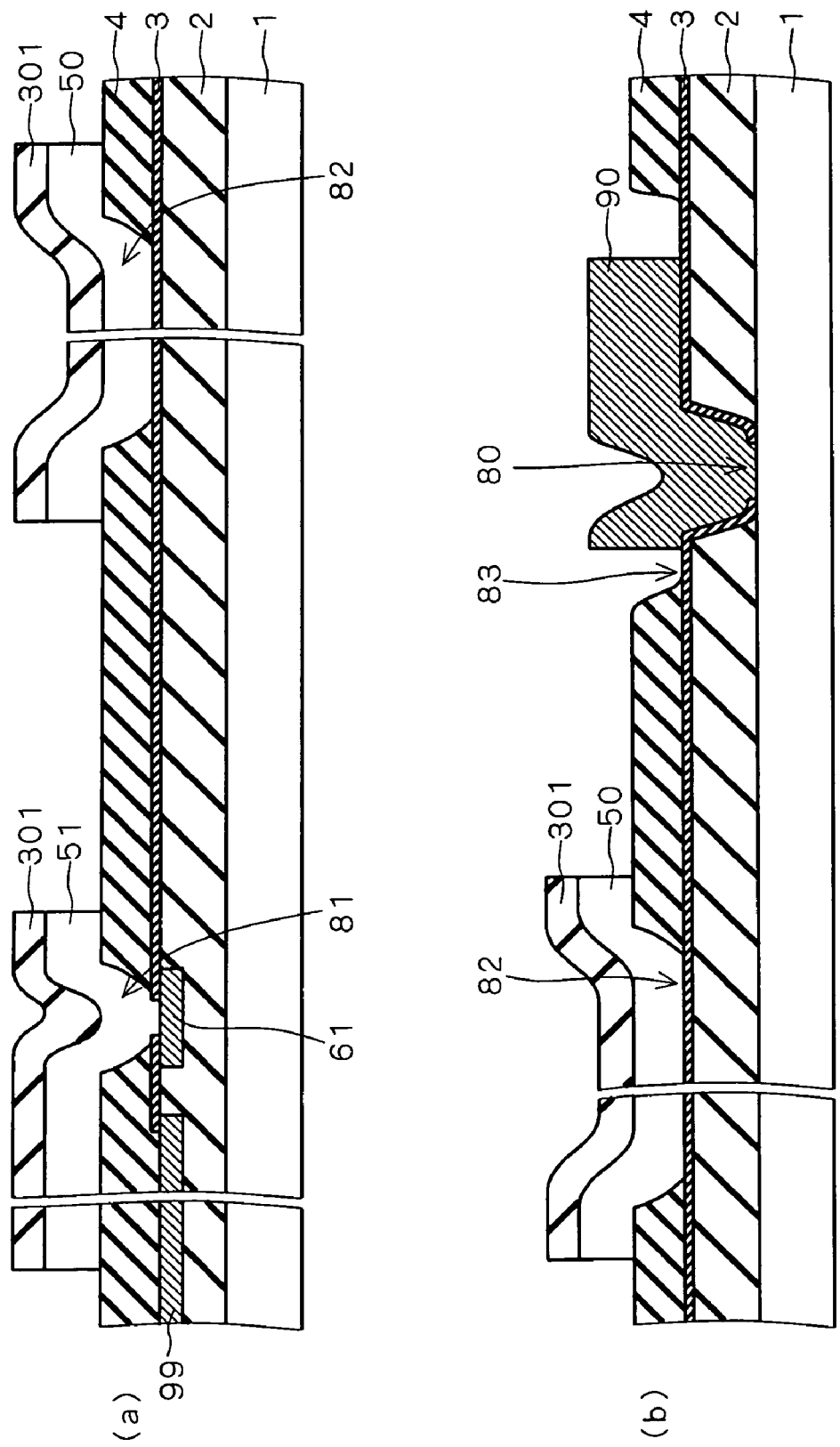

Next, the metal film 9 is selectively removed by etching using the photoresist 303 as a mask, so as to form the electrode 90 in contact with the semiconductor substrate 1 as shown in FIG. 11. Subsequently, the sacrificial layer 4 and TEOS film 301 are removed by etching to obtain the structure shown in FIG. 2. The etching of the sacrificial layer 4 employs wet-etching using HF, for example.

FIG. 12 is a cross-sectional view used to explain an advantage of the first preferred embodiment of the invention. If the opening 80 for making contact between the electrode 90 and semiconductor substrate 1 is formed after formation of the semiconductor film 50 and fixed electrodes 51 (and the fixed electrodes 52 and mass body 53, though not shown in the diagram), then it is necessary to form photoresist 304 that opens the area where the opening 80 is to be formed. The photoresist 304 covers the insulating film 3 in the opening 83, and also covers the semiconductor film 50 and fixed electrode 51; then the step height to be covered is approximately equal to the large sum of the thickness of the semiconductor film 50, the fixed electrode 51 (hence the thickness of the doped polysilicon film 5) and the thickness of the sacrificial layer 4, which requires forming the photoresist 304 thick. However, forming the photoresist 304 thick may incur cracks and thus requires plural application steps to avoid cracks, and may also cause a reduction in etching rate.

By contrast, the invention is advantageous in that it does not require thick formation of photoresist, since the opening 80 for formation of the electrode 90 is formed before the sacrificial layer 4, semiconductor film 50, and fixed electrodes 51 are formed.

SECOND PREFERRED EMBODIMENT

Figure 13:
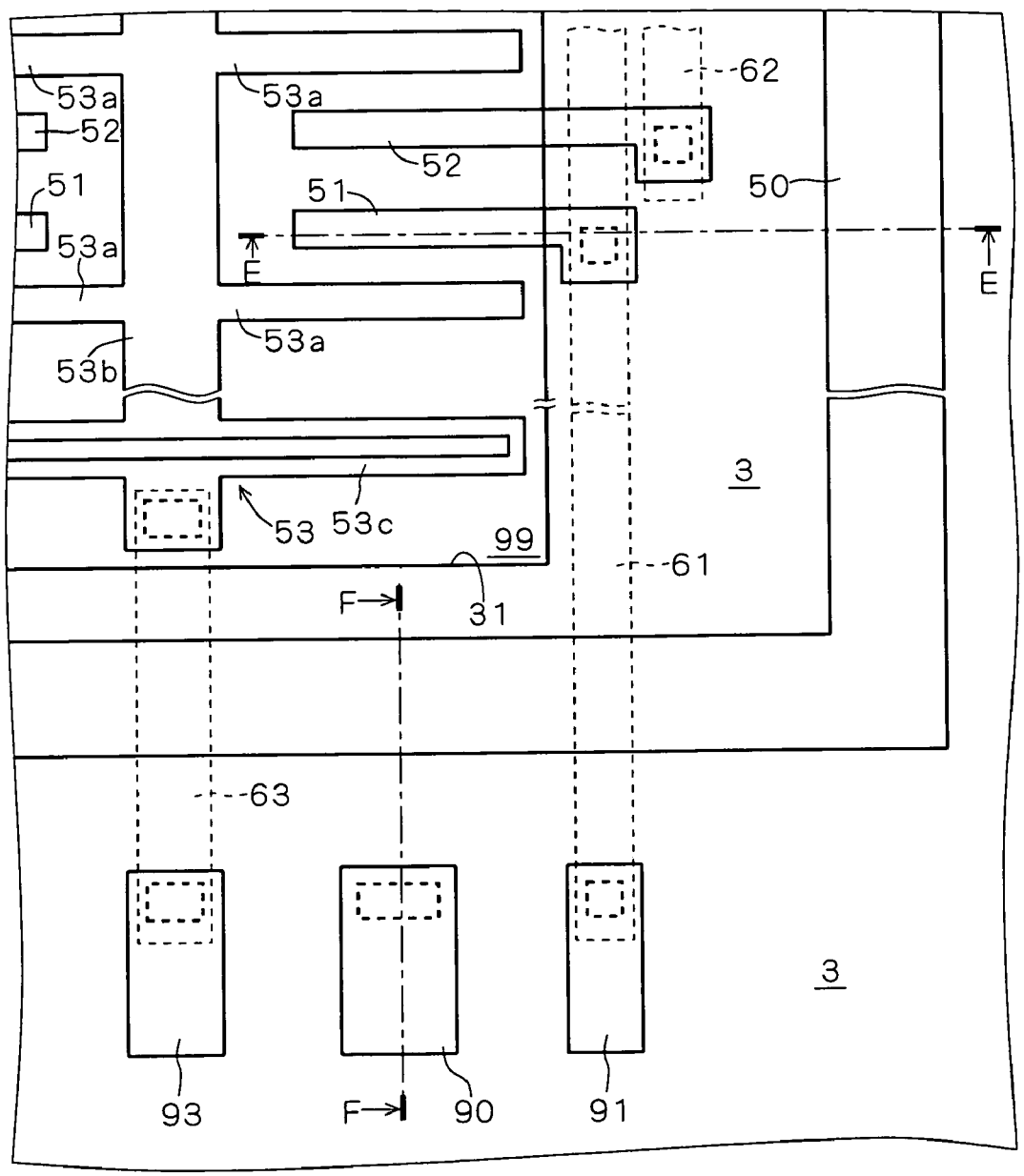
FIG. 13 is a plan view showing part of the structure of an acceleration sensor to which the manufacturing method of a second preferred embodiment of the invention can be applied.
Figure 14:
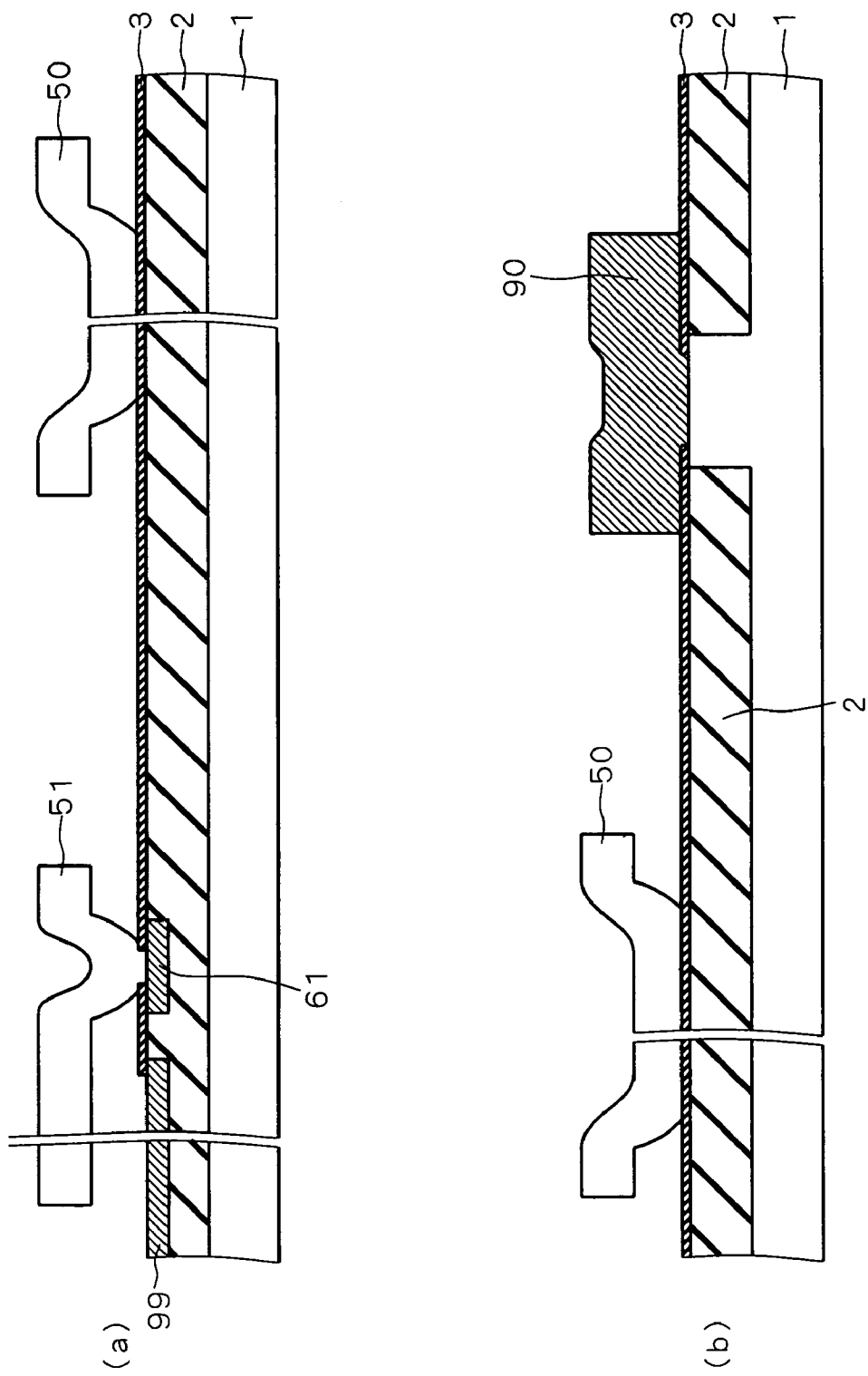
FIGS. 14(a) and 14(b) are cross-sectional views respectively taken along line E—E and line F—F in FIG. 13.

FIG. 13 is a plan view showing part of the structure of an acceleration sensor to which the manufacturing method of a second preferred embodiment of the invention can be applied. FIGS. 14(a) and (b) respectively show the cross-sections taken along lines E—E and F—F in FIG. 13. The lines E—E and F—F in FIG. 13 respectively correspond to lines A—A and B—B in FIG. 1.

While, in the acceleration sensor of the first preferred embodiment, the electrode 90 extends through the insulating layer 2 to reach the semiconductor substrate 1, the acceleration sensor of this preferred embodiment characteristically differs from it in that the semiconductor substrate 1 extends through the insulating layer 2.

A sequence of process steps for manufacturing the acceleration sensor having this structure is now described referring to FIGS. 15 to 23. Note that the diagrams denoted by (a) and (b) in each drawing respectively show cross-sections taken along lines E—E and F—F in FIG. 13.

First, as shown in FIG. 15, a semiconductor substrate 1 is prepared. The semiconductor substrate 1 has a locally projecting raised portion 1a in the position where the electrode 90 is formed later. Such raised portion 1a may be formed by, for example, applying anisotropic etching with that area for electrode 90 covered by a mask and thus reducing the thickness of the unmasked portion of the semiconductor substrate 1.

Figure 16:
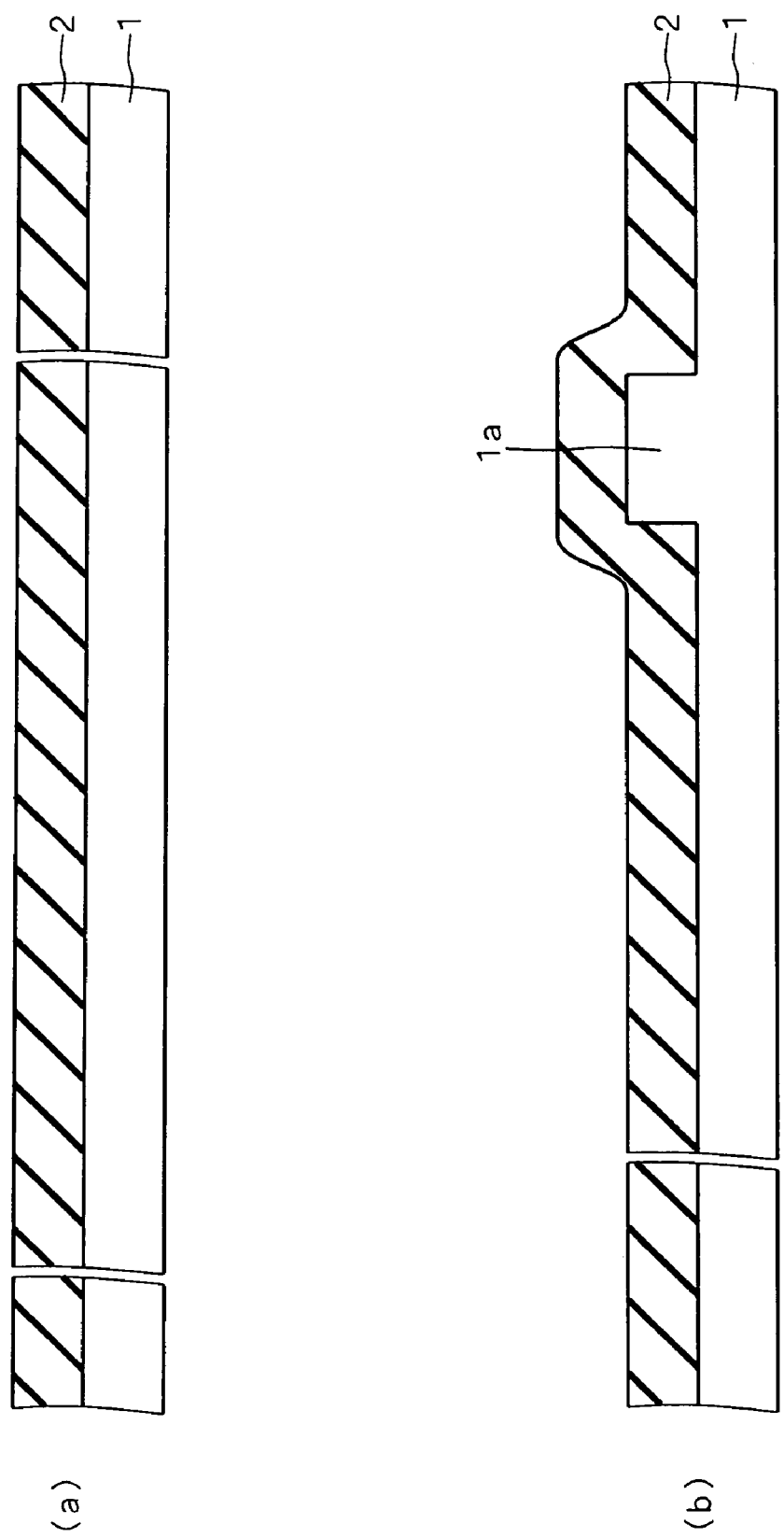

Next, as shown in FIG. 16, insulating layer 2 is formed on the surface of the semiconductor substrate 1 where the raised portion 1a is present (hereinafter referred to as "surface"). The insulating layer 2 is raised in the vicinity of the raised portion 1a, reflecting the shape of the raised portion 1a.

Next, the insulating layer 2 is etched back for planarization, whereby the top surface of the raised portion 1a is exposed. Then the surface portions of the insulating layer 2 where interconnection 61 and shield film 99 are to be formed are removed by etching, which is followed by formation of the interconnection 61 and shield film 99. The surfaces of the interconnection 61 and shield film 99 are formed nearly level with the surface of the insulating layer 2. Then insulating film 3 is selectively formed on the insulating layer 2, interconnection 61, and shield film 99. More specifically, the insulating film 3 has opening 31 that exposes the shield film 99; center portions of the interconnection 61 and raised portion 1a are exposed, too. The insulating film 3 is formed all over the surface of the structure shown in FIG. 16 and then selectively removed by etching using a photoresist as a mask, so as to obtain the structure shown in FIG. 17. As described in the first preferred embodiment, the application of this photoresist does not have to be achieved by repeating plural application steps, and no reduction in etching rate is incurred. Although not shown in FIG. 17, interconnections 62, 63 are formed in the same way as the interconnection 61.

Figure 17:
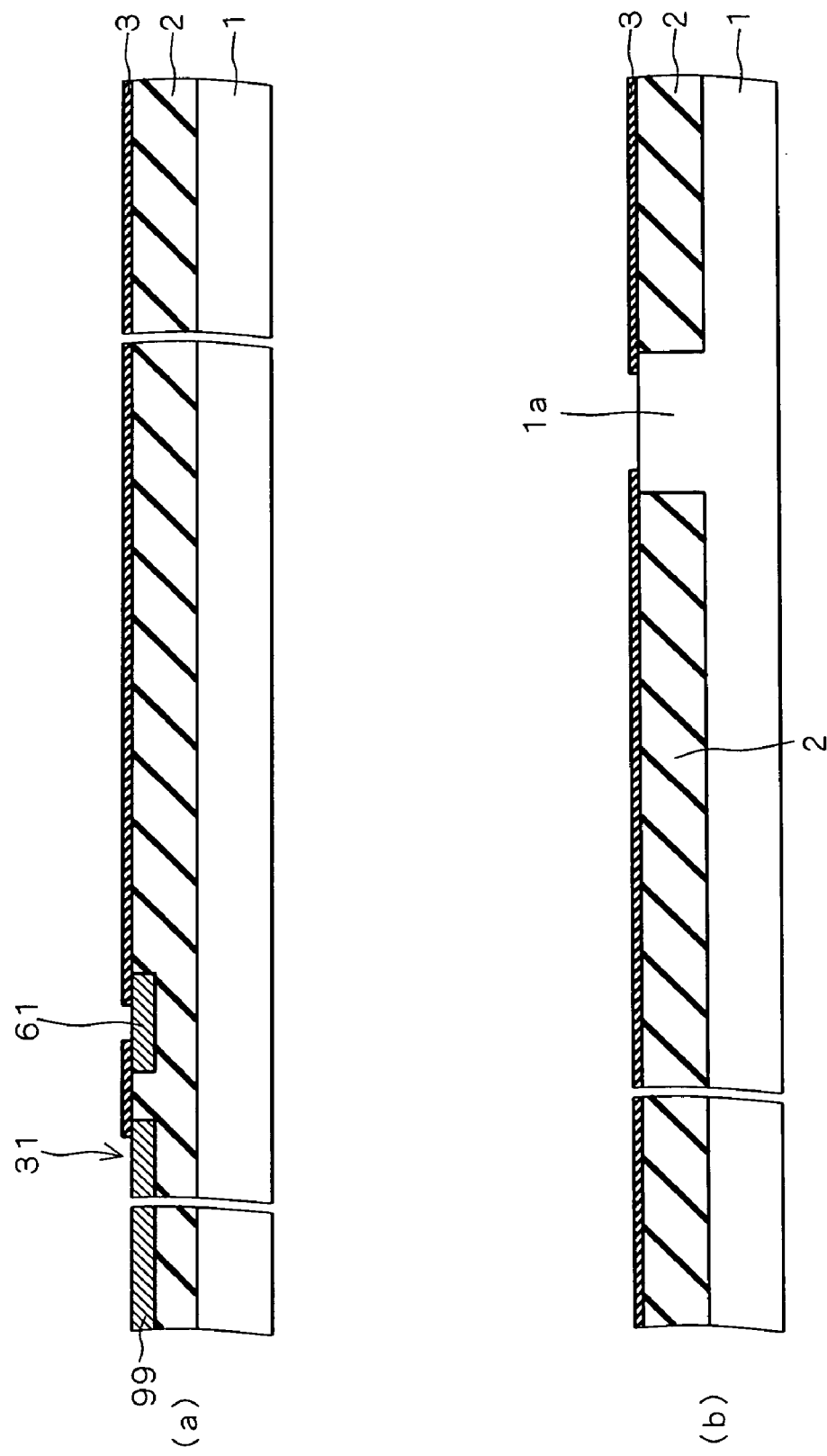
Figure 18:
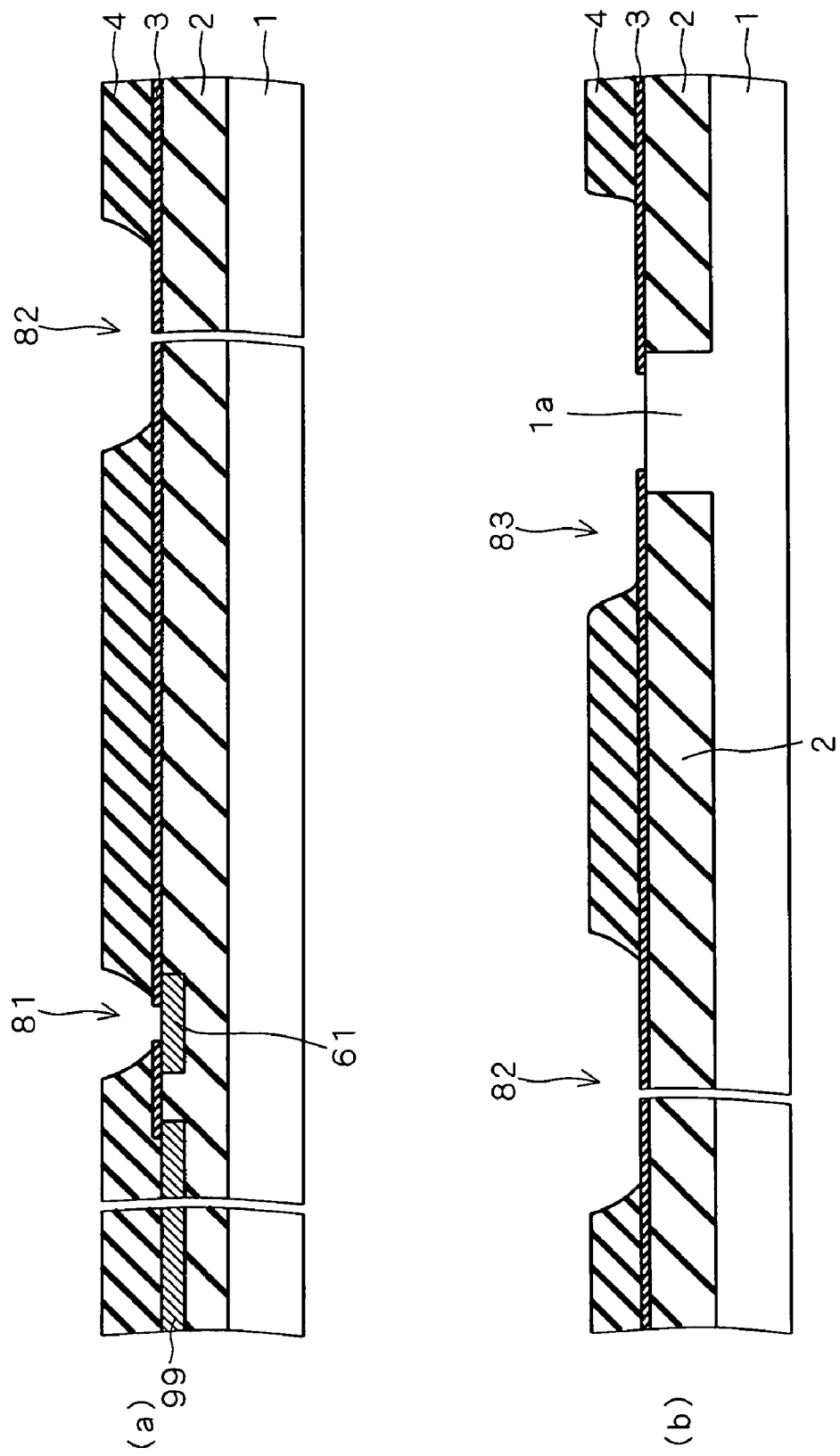

Next, as shown in FIG. 18, sacrificial layer 4 is selectively formed on the upper side of the structure shown in FIG. 17. More specifically, the sacrificial layer 4 has an opening 81 formed over the interconnection 61 (and similarly, though not shown in FIG. 18, also over the interconnections 62 and 63) to expose the edges of the insulating film 3 and the center portion of the interconnection 61, an opening 82 that exposes the insulating film 3 in the area where the semiconductor film 50 is to be formed later, and an opening 83 that exposes the center portion of the raised portion 1a and the insulating film 3 that surrounds the raised portion 1a.

The sacrificial layer 4 is formed all over the surface of the structure shown in FIG. 17 and then selectively removed by etching using a photoresist as an etching mask, so as to obtain the structure shown in FIG. 18. As mentioned in the first preferred embodiment, this etching mask does not have to be applied in plural application steps, and no reduction in etching rate is incurred.

Figure 20:
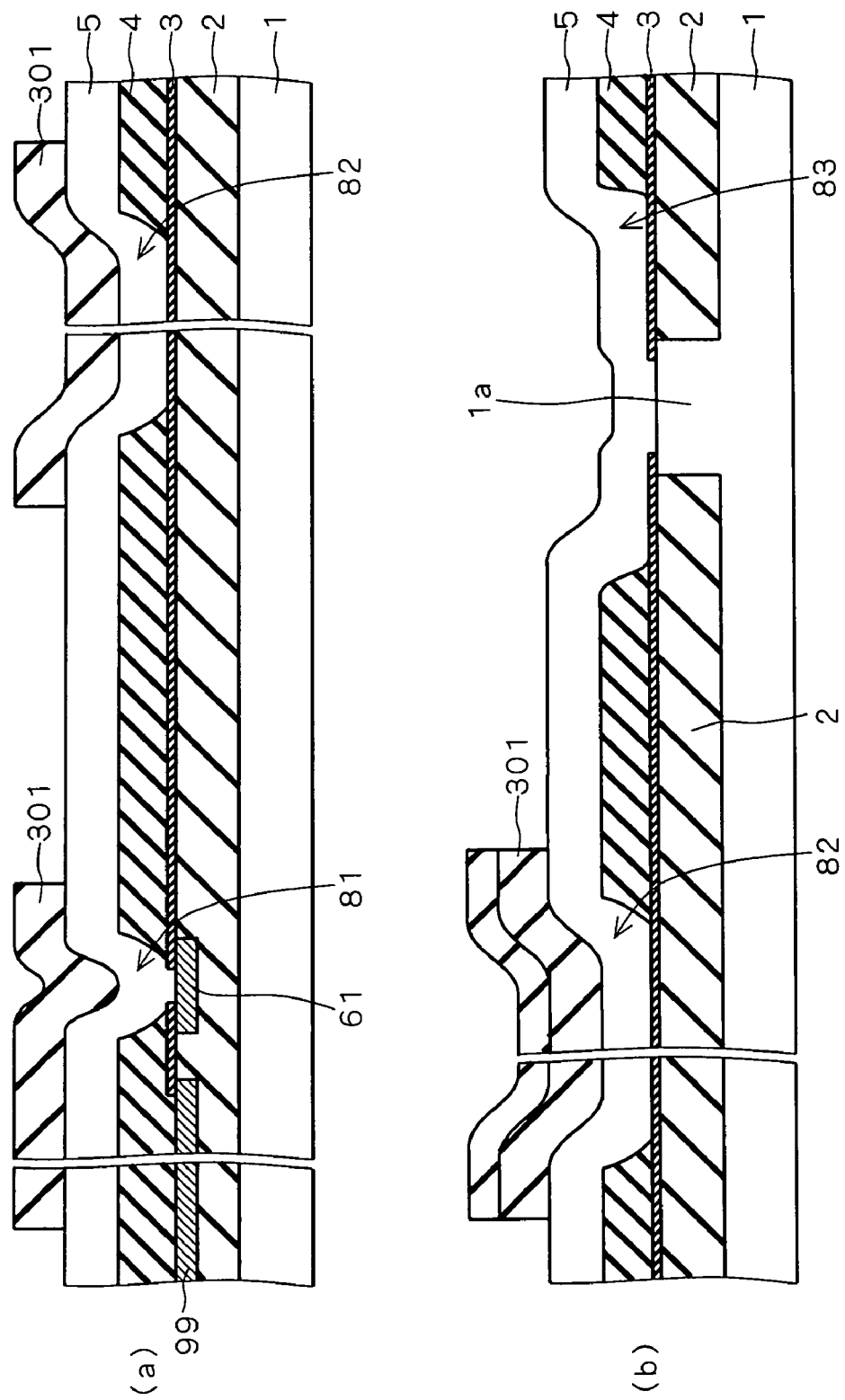

Next, as shown in FIG. 19, doped polysilicon film 5 and TEOS film 301 are stacked in this order on the upper side of the structure shown in FIG. 18. Then photoresist 302 is applied on the TEOS film 301 and patterned so that the photoresist 302 remains in the areas where the semiconductor film 50, fixed electrodes 51, 52, and mass body 53 are to be formed. Step coverage is insignificant since the step height to be covered by the photoresist 302 is only about the film thickness of the sacrificial layer 4, so that the photoresist 302 can be formed thin. Next, using the photoresist 302 as an etching mask, the TEOS film 301 is etched and patterned (FIG. 20).

Figure 21:
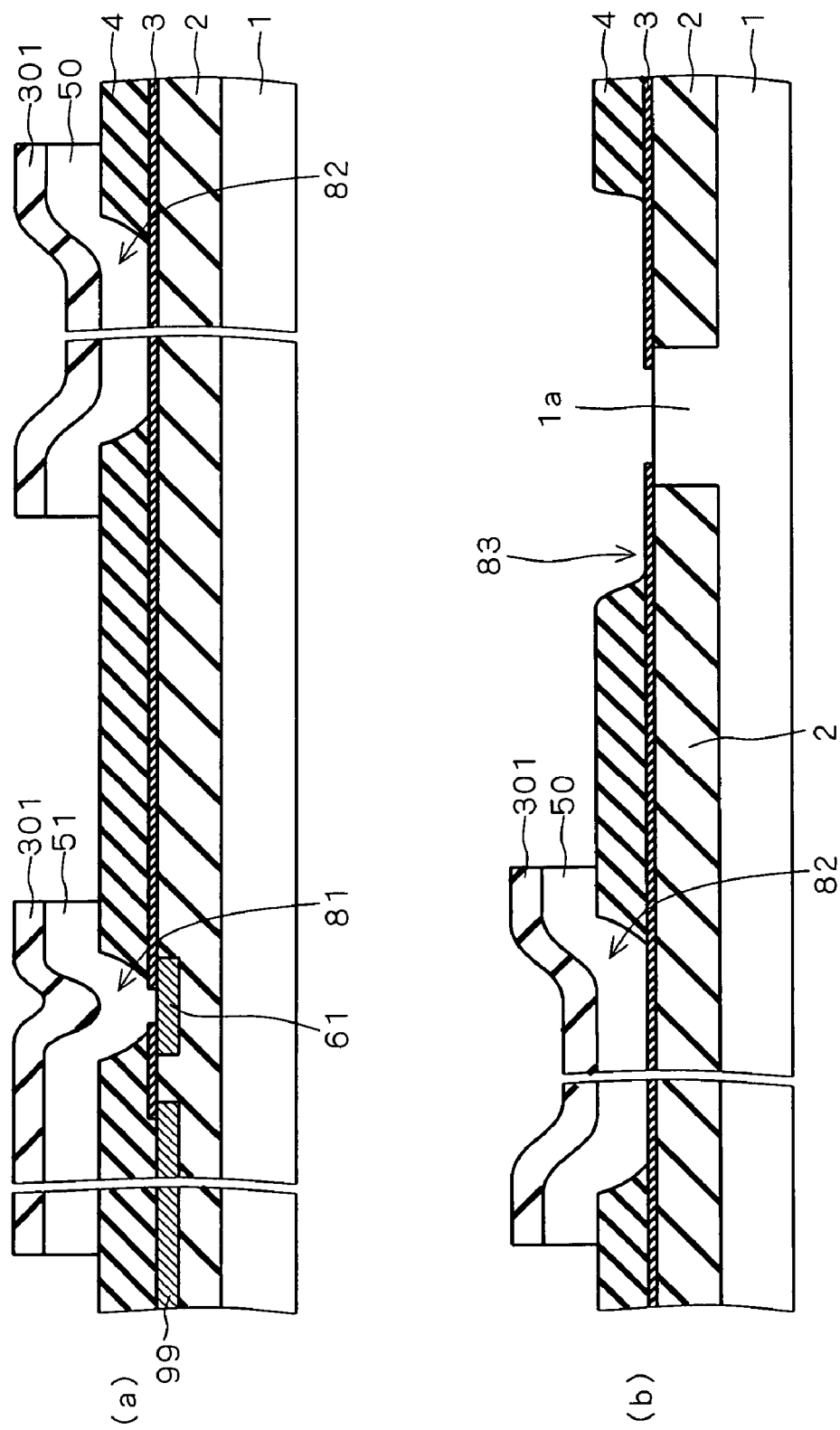

Next, using the remaining TEOS film 301 as a hard mask, the doped polysilicon film 5 is etched to form semiconductor film 50 and fixed electrode 51 as shown in FIG. 21. This etching may possibly reduce the film thickness of the TEOS film 301 to about 60%, for example. Though not shown in FIG. 21, the fixed electrodes 52 and mass body 53 are formed in the same way. In the opening 83, the insulating film 3 is exposed and the center portion of the raised portion 1a is exposed from it.

Figure 22:
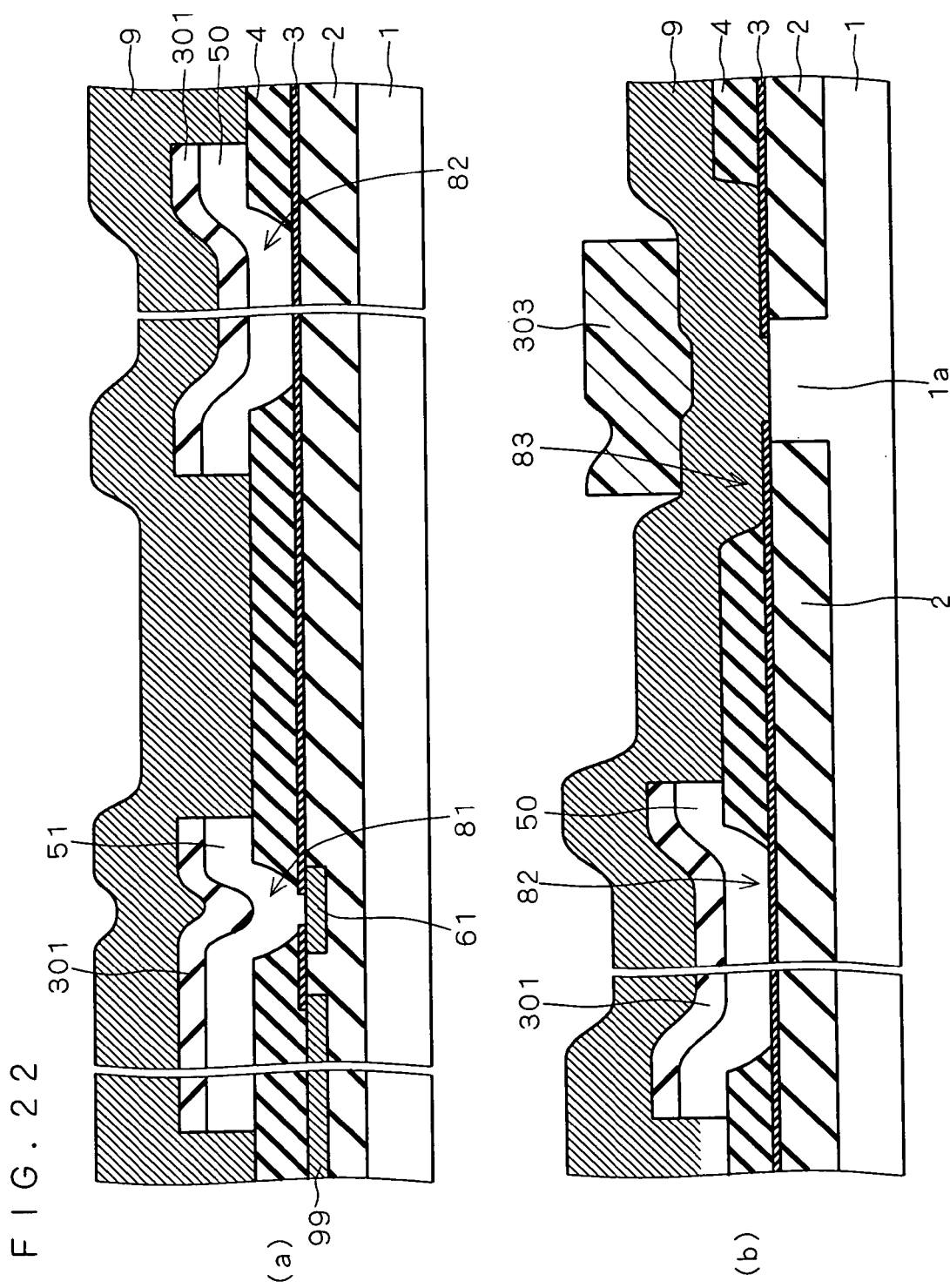

Next, as shown in FIG. 22, metal film 9 is formed all over the surface of the structure shown in FIG. 21, with a patterned photoresist 303 covering the metal film 9 in the position where the electrode 90 is to be formed. As mentioned in the first preferred embodiment, the photoresist 303 does not have to be applied in plural application steps and no reduction in etching rate is incurred.

Next, using the photoresist 303 as a mask, the metal film 9 is etched and selectively removed, so as to form the electrode 90 as shown in FIG. 23. Subsequently, the sacrificial layer 4 and TEOS film 301 are removed by etching to obtain the structure shown in FIG. 14.

Thus, the manufacturing of the acceleration sensor illustrated in this preferred embodiment does not involve formation of opening 80 for forming the electrode 90, which is advantageous in that no thick photoresist is required.

THIRD PREFERRED EMBODIMENT

Figure 24:
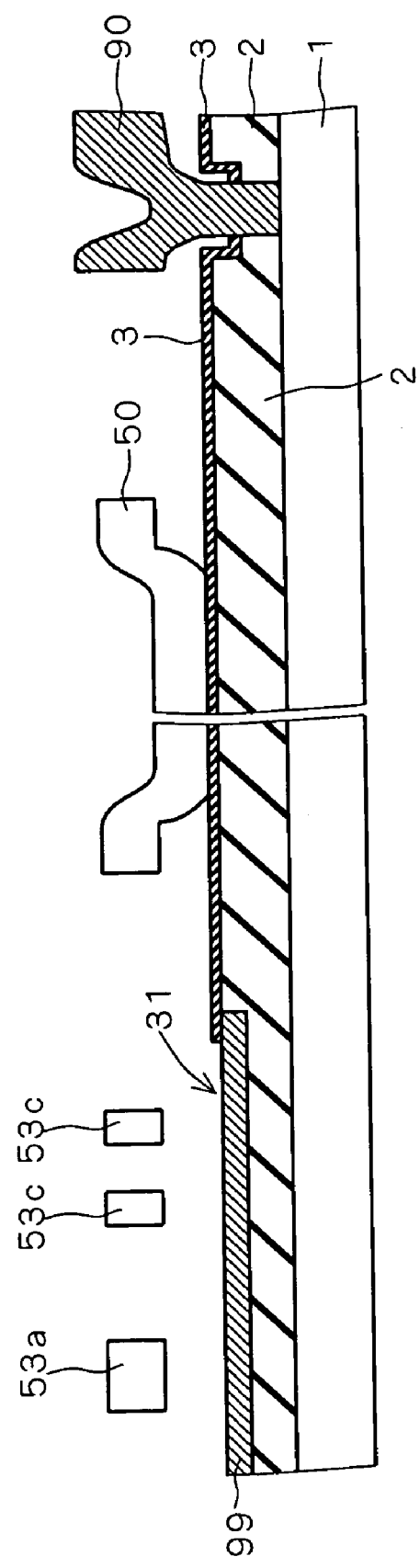
FIG. 24 is a cross-sectional view showing part of the structure of an acceleration sensor to which the manufacturing method of a third preferred embodiment of the invention can be applied.

FIG. 24 shows a cross-sectional view taken along line C—C in FIG. 1. In this cross section, the movable electrode 53a and the elastic portion 53c are provided above the opening 31 that exposes the shield film 99. The semiconductor film 50 is provided in the region where the insulating film 3 is present and the electrode 90 extends through the insulating layer 2 and insulating film 3 to reach the semiconductor substrate 1.

A sequence of process steps for manufacturing an acceleration sensor having this structure is now described referring to FIGS. 25 to 33. Each figure shows a cross-sectional view taken along line C—C in FIG. 1.

Figure 25:
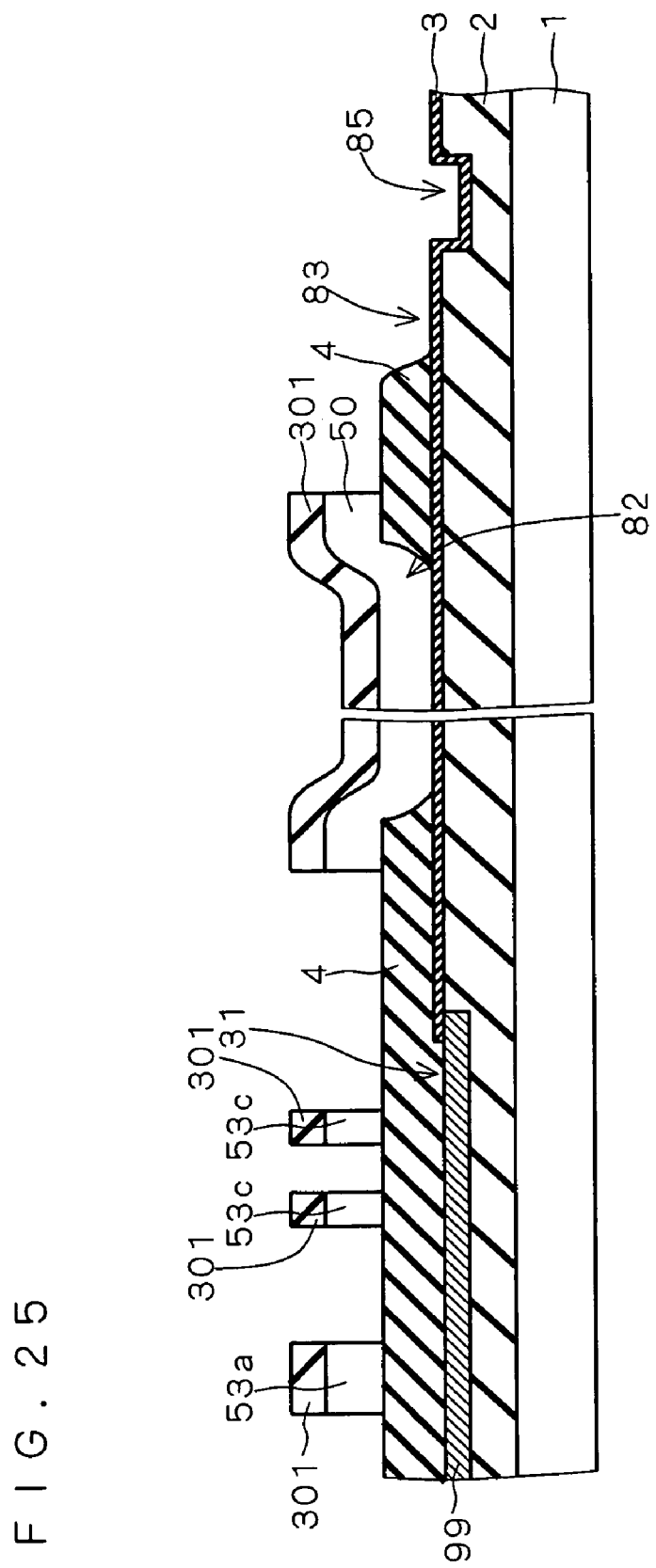
FIGS. 25 to 34 are cross-sectional views showing a sequence of process steps for manufacturing the acceleration sensor of the third preferred embodiment.

First, insulating layer 2 is provided on the semiconductor substrate 1. Next, the surface portion of the insulating layer 2 where the electrode 90 is to be formed is removed by etching to form a recessed portion 85. This etching is conducted in the same process for etching the surface portion of the insulating layer 2 where the shield film 99 is to be formed and the surface portions where the interconnections 61, 62 and 63 are to be formed, though not shown in the C—C section. Then, the shield film 99 is formed, and also the interconnections 61, 62 and 63 are formed, though not shown in the C—C section. Subsequently, the insulating film 3 having the opening 31 is formed. While the insulating film 3 covers the insulating layer 2 also in the recessed portion 85, it exposes the shield film 99 in the opening 31. Subsequently, the sacrificial layer 4 is selectively formed and then the semiconductor film 50, fixed electrodes 51, 52, and mass body 53 are formed (FIG. 25). Note that the fixed electrodes 51, 52 and the rod 53b of mass body 53 are not shown in the cross section shown in FIG. 25. The sacrificial layer 4 has openings 82 and 83. The semiconductor film 50 is in contact with the insulating film 3 through the opening 82, and the opening 83 exposes the insulating film 3 in an area including the recessed portion 85 and larger than that.

Figure 26:
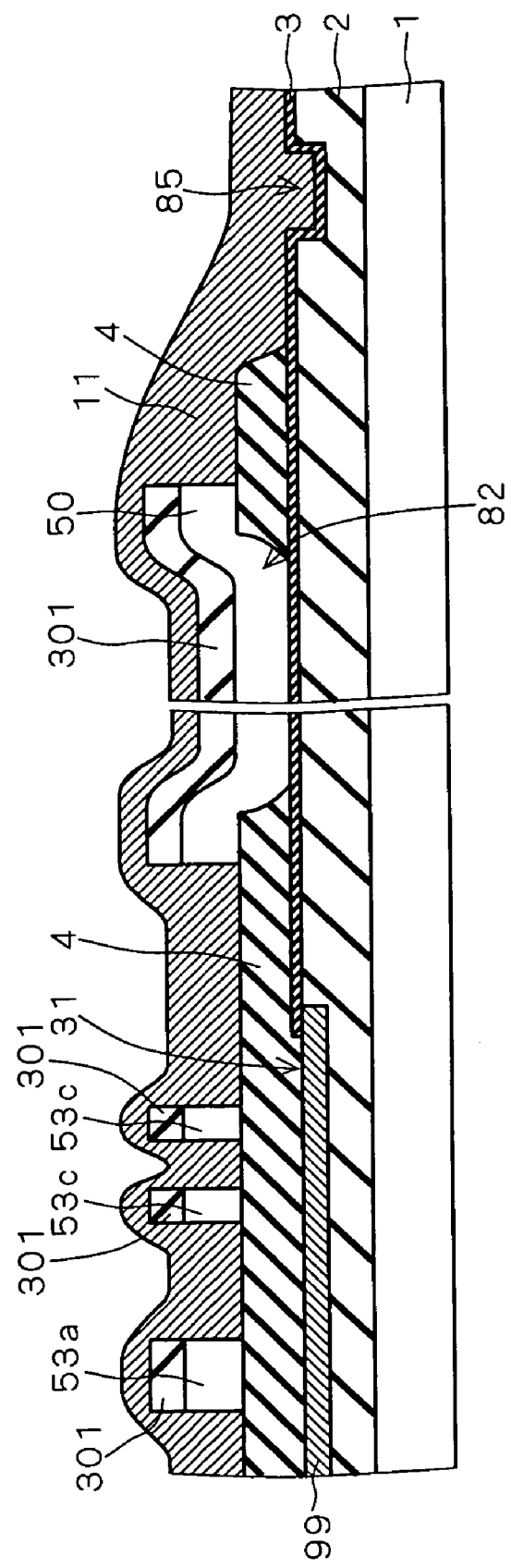
Figure 27:
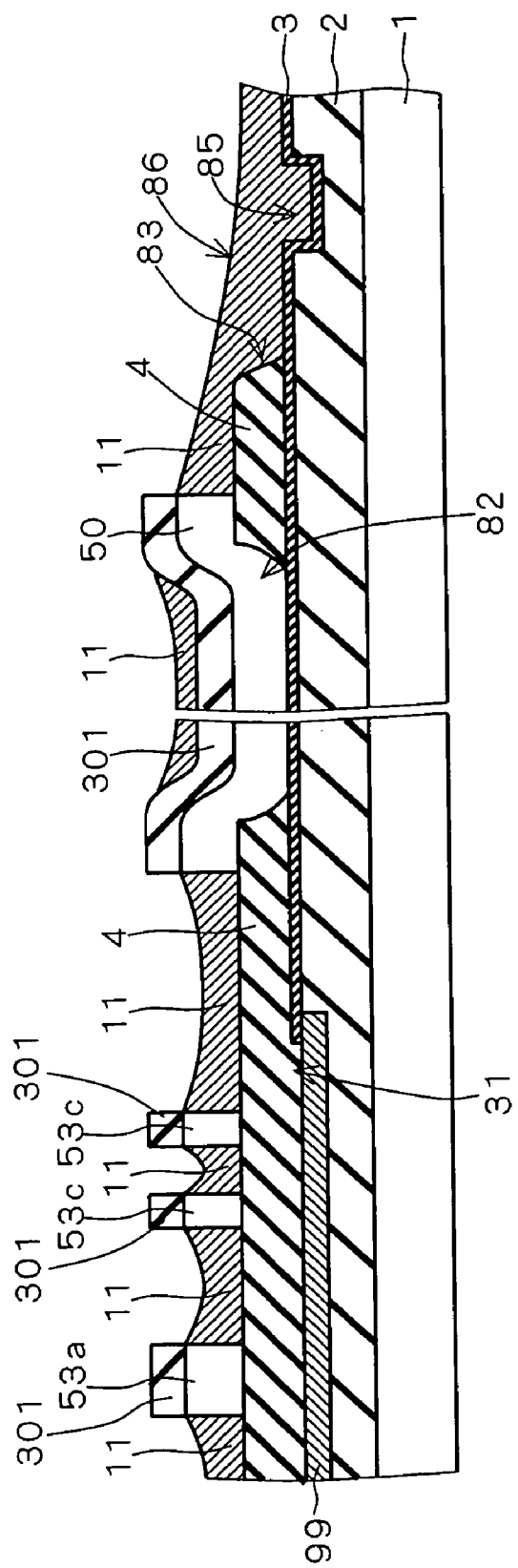

Next, a new sacrificial layer 11 is formed all over the surface of the structure shown in FIG. 25 to obtain the structure shown in FIG. 26. The sacrificial layer 11 is formed so that it goes into even small recesses of the underlying structure. For example, a silicon oxide film is adopted as the sacrificial layer 11; desirably, a PSG (phospho-silicate glass) film or a BPSG (boro-phospho-silicate glass) film are adopted. This is because adopting such films allows low-temperature processing, easy formation of a large film thickness, and stress reduction. The sacrificial layer 11 is etched back so that it still covers the sacrificial layer 4 and insulating film 3 and exposes the top surfaces of the semiconductor film 50, fixed electrodes 51, 52 and mass body 53: thus the structure shown in FIG. 27 is obtained.

Figure 28:
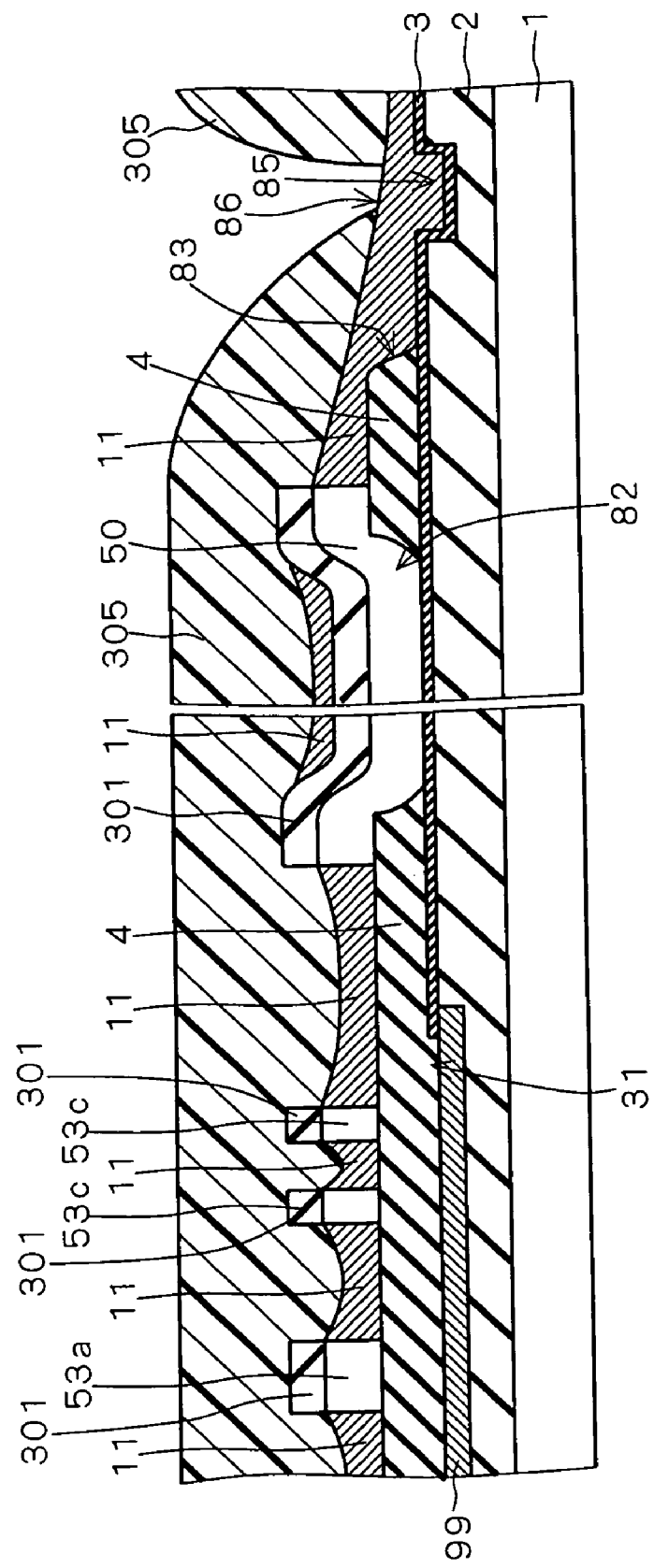

Subsequently, a photoresist 305 is provided all over the surface of the structure shown in FIG. 27. Note that the photoresist 305 is patterned to form an opening 86 that opens inside the recessed portion 85 (FIG. 28). Since the sacrificial layer 11 remains in the opening 83, the step height to be covered by the photoresist 305 is smaller than when the sacrificial layer 11 is absent. This allows the photoresist 305 to be formed thinner.

Figure 29:
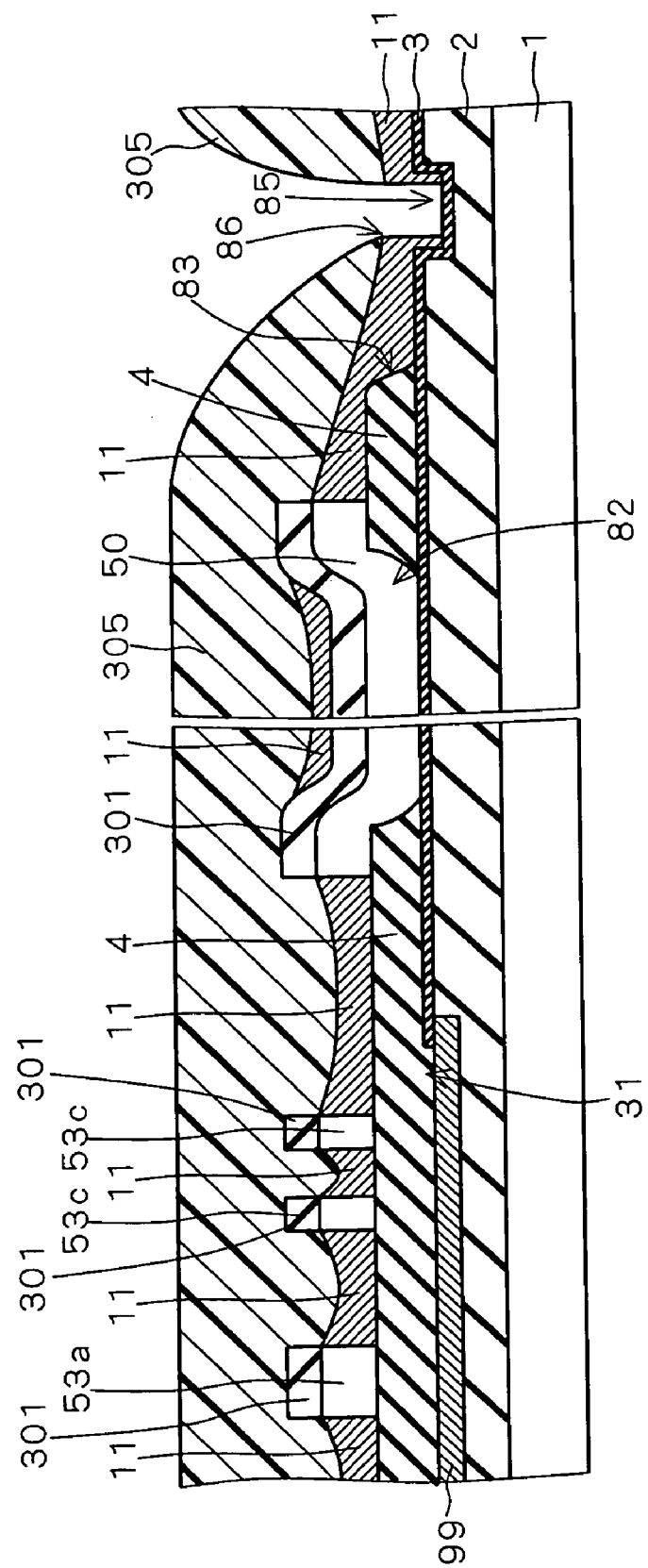

Next, using the photoresist 305 as an etching mask, the sacrificial layer 11 is etched to remove the sacrificial layer 11 in the opening 86. That is to say, in the opening 86, the sacrificial layer 11 allows the insulating film 3 to be exposed in an area smaller than the recessed portion 85 (FIG. 29).

Figure 30:
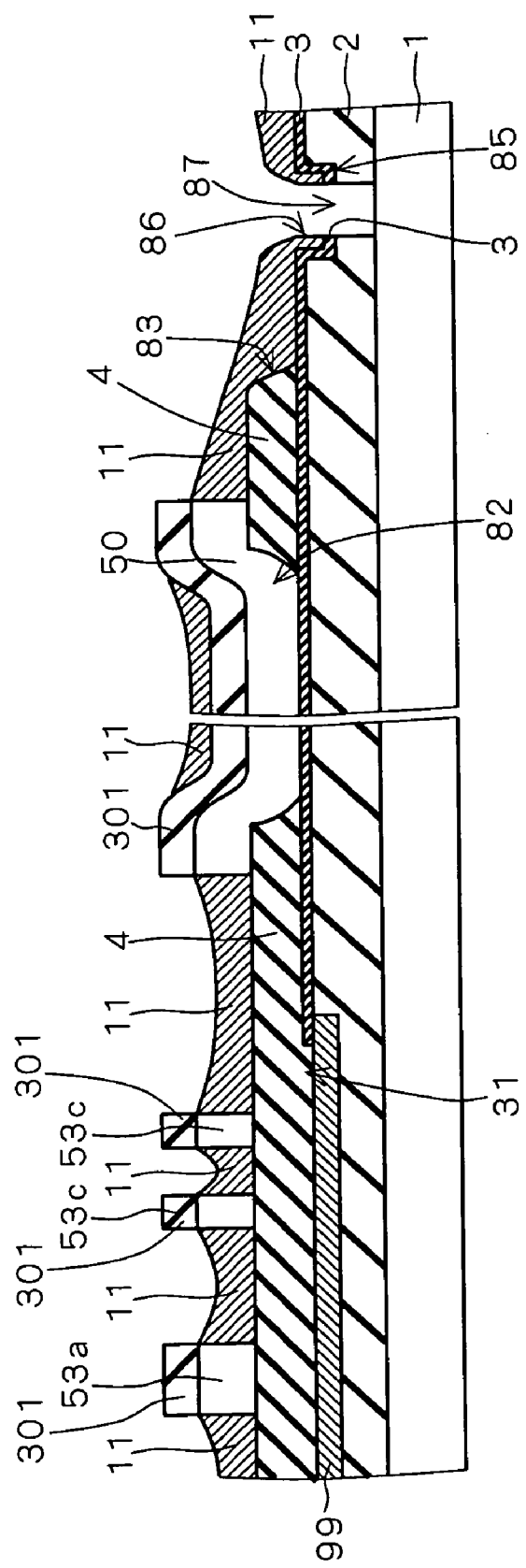
Figure 31:
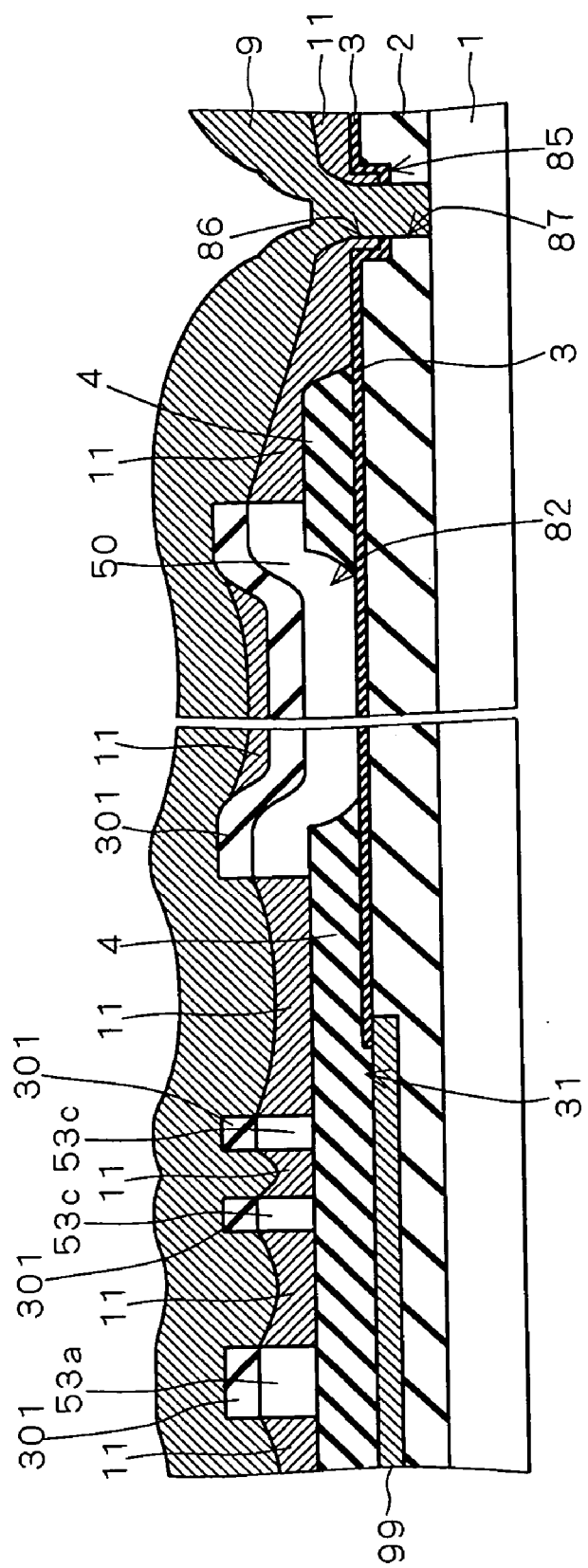
Figure 32:
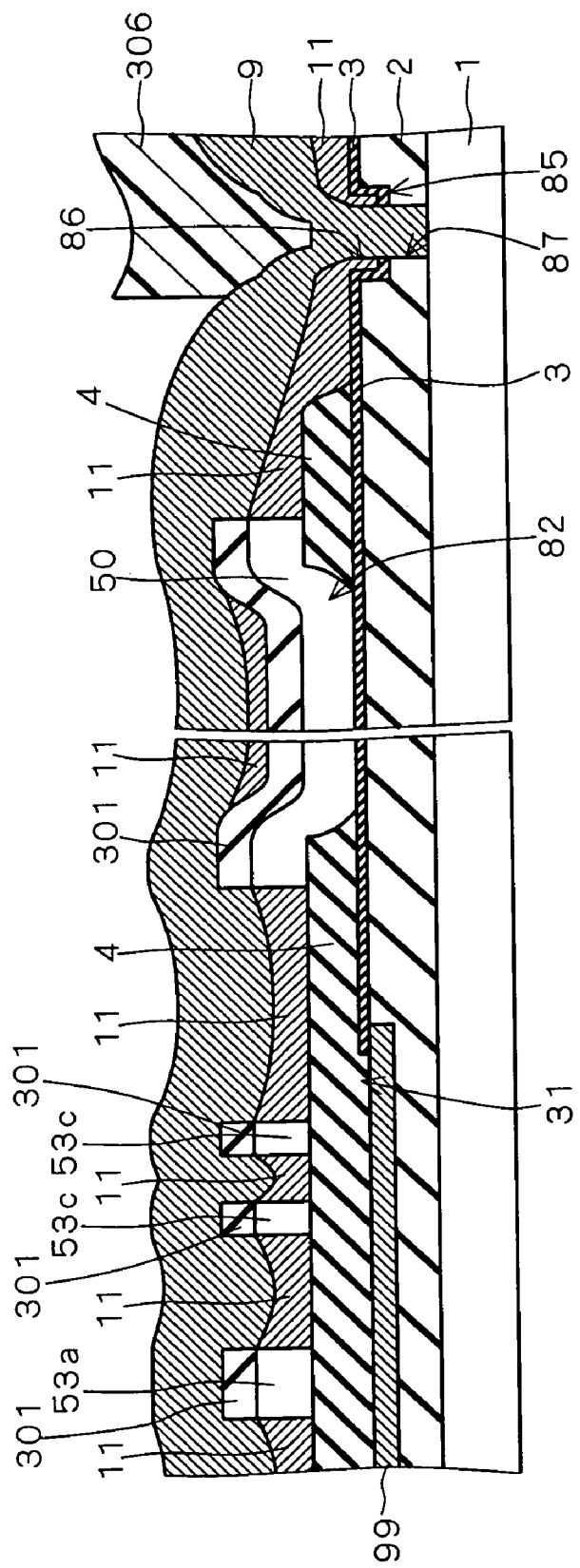
Figure 33:
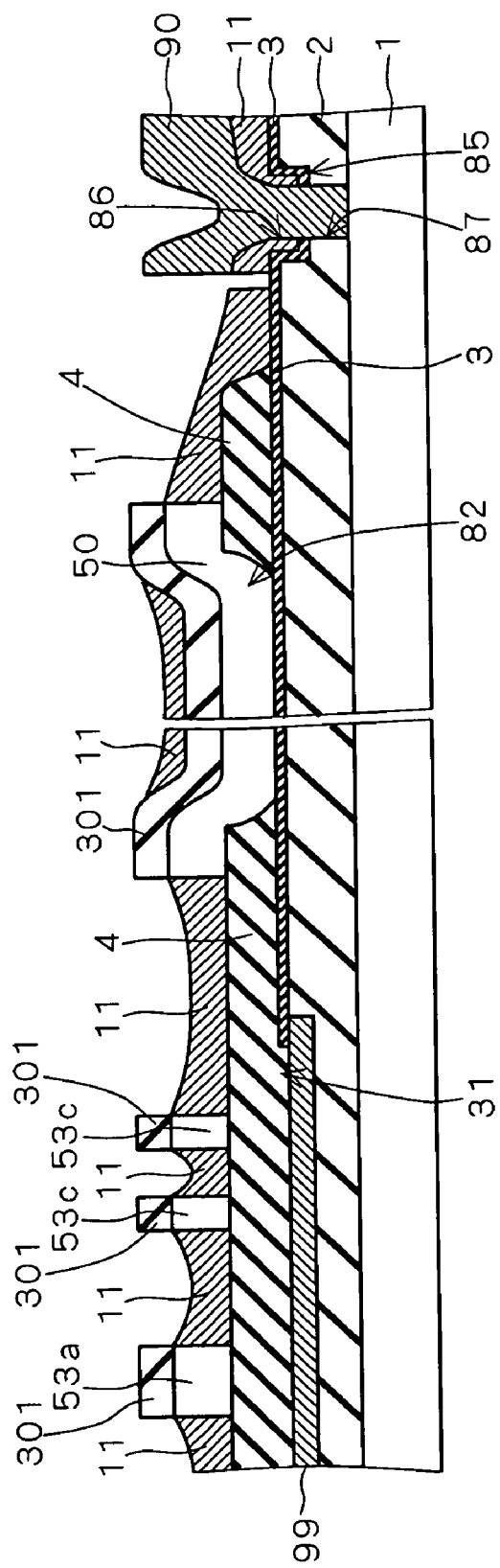

Subsequently, using the photoresist 305 as an etching mask, the insulating film 3 and insulating layer 2 are selectively etched as shown in FIG. 30, so as to expose the semiconductor substrate 1 in an opening 87: like the opening 86, the opening 87 opens inside the opening 85. Then, as shown in FIG. 31, metal film 9 is formed all over the surface and thus the metal film 9 comes in contact with the semiconductor substrate 1 exposed in the opening 87. Then, as shown in FIG. 32, an etching mask is formed using the photoresist 306, covering the metal film 9 outside of the opening 86 and opening 87, e.g., outside of the opening 85. Then, using the photoresist 306 as an etching mask, the metal film 9 is etched to form the electrode 90 as shown in FIG. 33. Subsequently, the sacrificial layers 4, 11 and TEOS film 301 are removed to obtain the structure shown in FIG. 24.

Figure 34:
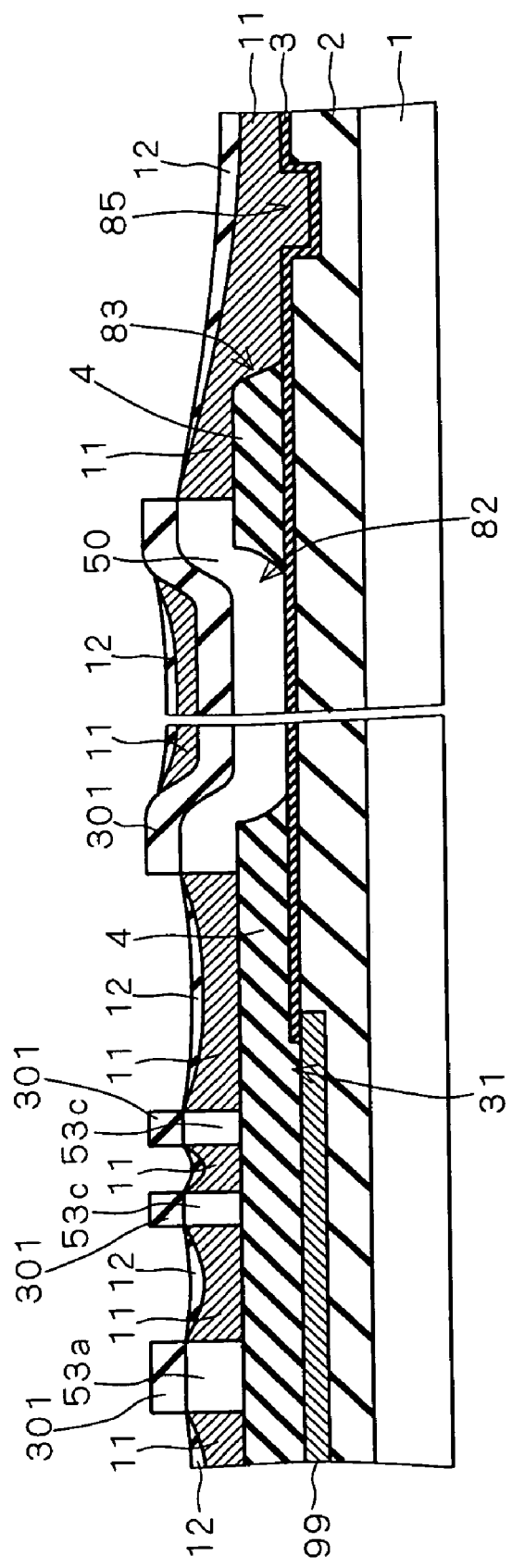

FIG. 34 is a cross-sectional view showing a modification of this preferred embodiment. It is also desirable to further form an SOG film 12 after the etch-back of the sacrificial layer 11 in order to fill in the dent of the sacrificial layer 11. This further reduces the step height to be covered by the photoresist 305 applied later.

Thus, according to this preferred embodiment, surface undulations are reduced with the sacrificial layer 11 prior to the formation of the electrode 90, which is advantageous in that the photoresist 305 does not have to be formed thick.

The opening 87 is formed by selectively etching the insulating film 3 and insulating layer 2, and the formation of opening 87 causes the semiconductor substrate 1 to be exposed in the position where it comes in contact with the electrode 90. Therefore this preferred embodiment is applicable even when the recessed portion 85 is not previously formed. However, previously forming the recessed portion 85 is desirable in order to reduce the amount of etch of the insulating film 2 during the formation of the opening 87.

FOURTH PREFERRED EMBODIMENT

Figure 35:
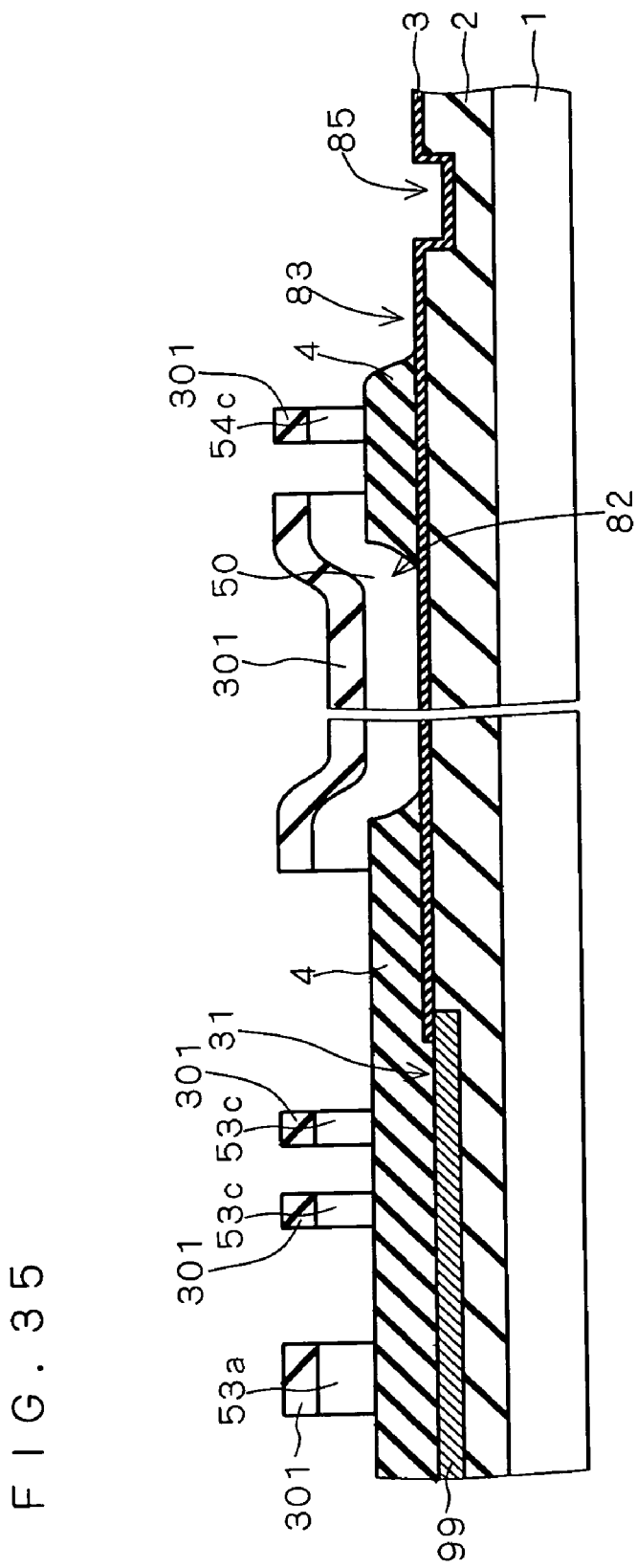
FIGS. 35 and 36 are cross-sectional views showing a fourth preferred embodiment of the invention.

FIG. 35 is a cross-sectional view showing this preferred embodiment, which corresponds to FIG. 25 of the third preferred embodiment. According to this preferred embodiment, a dummy body 54 is formed during the formation of the semiconductor film 50, fixed electrodes 51, 52 and mass body 53 in the process described in the third preferred embodiment. The dummy body 54 does not have to contribute to the function of the acceleration sensor. The dummy body 54 is provided on the sacrificial layer 4 between the opening 83 and the fixed electrode 51, mass body 53 and semiconductor film 50. However, unlike the semiconductor film 50, fixed electrodes 51, 52 and mass body 53, it does not have to be in contact with the insulating film 2 or insulating film 3 anywhere. Therefore it may be provided in contact with the sacrificial layer 4 and removed together with the sacrificial layer 4 during the later removal of the sacrificial layer 4.

Figure 36:
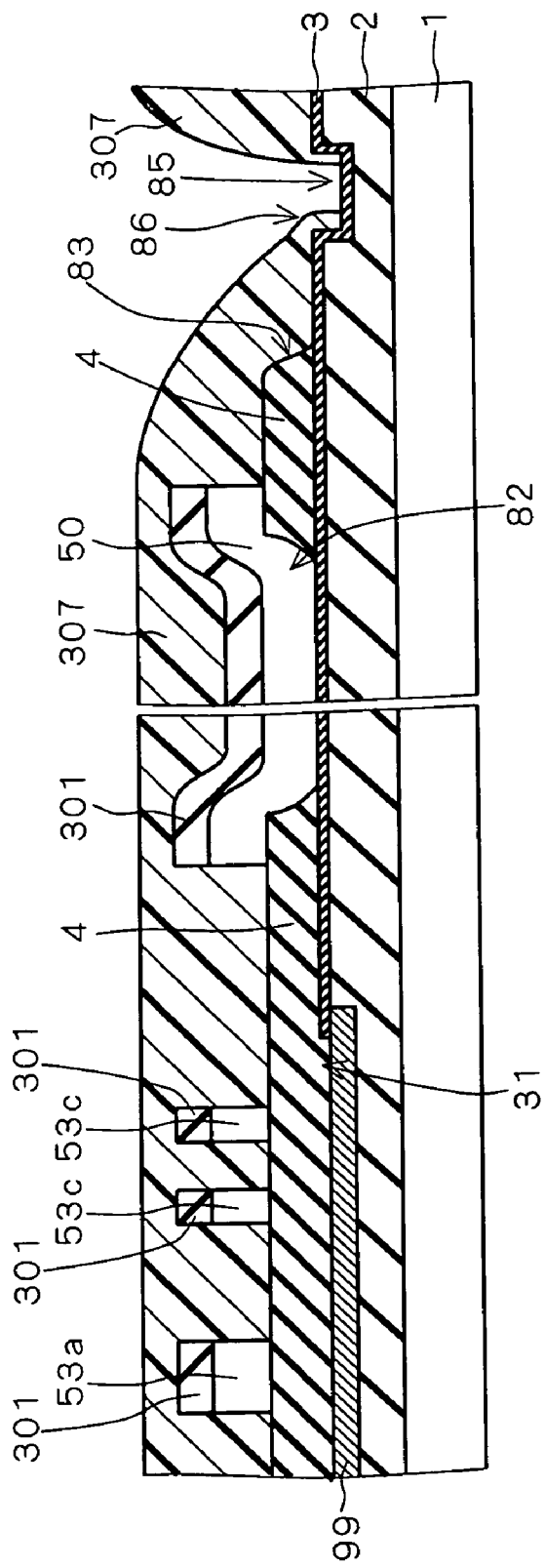

FIG. 36 shows a structure in which a photoresist 307 with a patterned opening 86 is formed in the structure shown in FIG. 35. The dummy body 54 is closer, than the fixed electrode 51, mass body 53 and semiconductor film 50, to the position where the electrode 90 is formed (in FIG. 36, the position where the recessed portion 85 is formed). Therefore, as compared with structures having no dummy body 54, the presence of the dummy body 54 reduces adverse effects on the acceleration sensor that would be caused when the thickness of the photoresist 307 is reduced in the vicinity of the position where the electrode 90 is formed. Moreover, no problem arises even when the dummy body 54 is not covered because of poor step coverage of the photoresist 307. That is to say, unlike the semiconductor film 50, the dummy body 54 does not affect the configuration of the acceleration sensor even if it is not covered by the photoresist 307 and therefore is etched.

Subsequently, using the photoresist 307 as a mask, the insulating film 3 and insulating layer 2 are etched to expose the semiconductor substrate 1. Then metal film 9 is deposited all over the surface and selectively etched to form the electrode 90 in contact with the exposed semiconductor substrate 1, followed by removal of the sacrificial layer 4.

This preferred embodiment is thus advantageous in that the photoresist 307 does not have to be formed thick.

FIFTH PREFERRED EMBODIMENT

Figure 37:
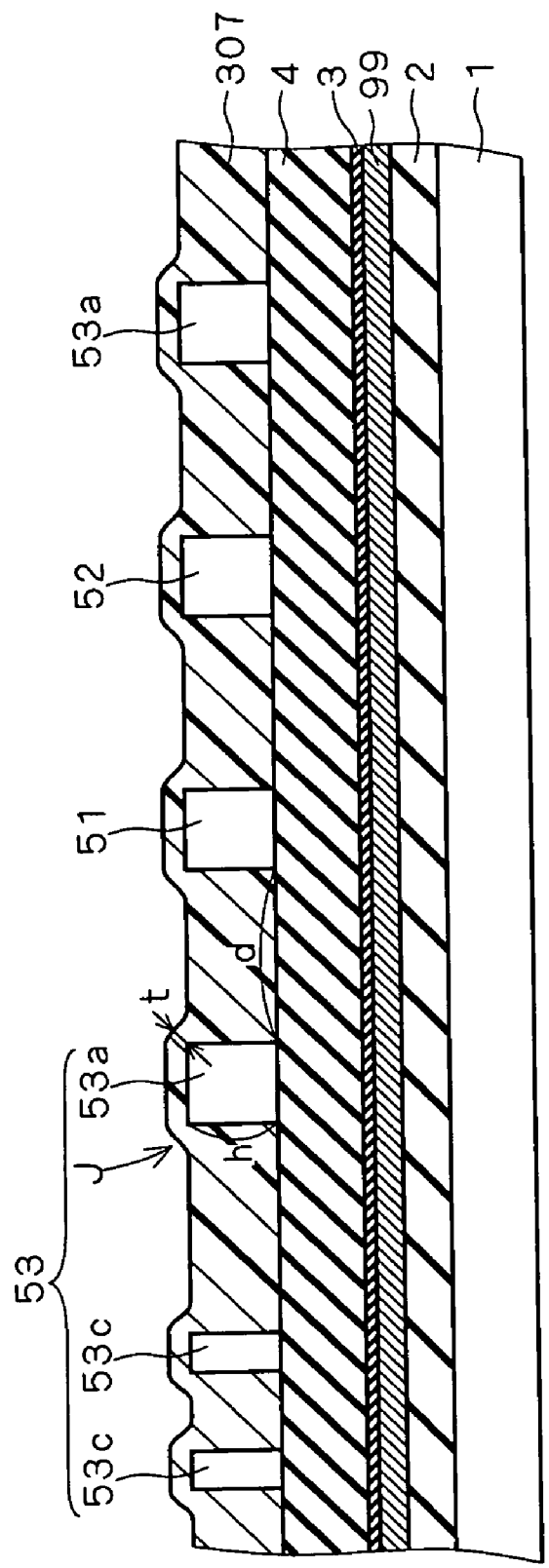
FIG. 37 is a cross-sectional view showing a fifth preferred embodiment of the invention.

FIG. 37 is a cross-sectional view taken along line D—D in FIG. 1 during the process step shown in FIG. 36. The insulating film 2, shield film 99, insulating film 3, and sacrificial layer 4 are stacked in this order on the semiconductor substrate 1, with the fixed electrodes 51, 52, elastic portion 53c, and movable electrodes 53a formed on the sacrificial layer 4. Note that the dummy body 54 is not shown in the section of FIG. 37. The diagram shows a process in which the photoresist 307 is formed thin and the surface of the photoresist 307 have undulations reflecting the shapes of the fixed electrodes 51, 52, elastic portion 53c, and movable electrodes 53a.

When the photoresist 307 is that thin, the photoresist 307 forms thinnest at the shoulders J of the fixed electrodes 51, 52, elastic portion 53c and movable electrodes 53a, i.e. at the edges J of the top surfaces of the fixed electrodes 51, 52, elastic portion 53c, and movable electrodes 53a. However, it is possible to prevent the photoresist 307 to form thin at the shoulders J by reducing distance d, or distances between the fixed electrodes 51, 52 and movable electrodes 53a and distances between the movable electrodes 53a and elastic portions 53c.

Figure 38:
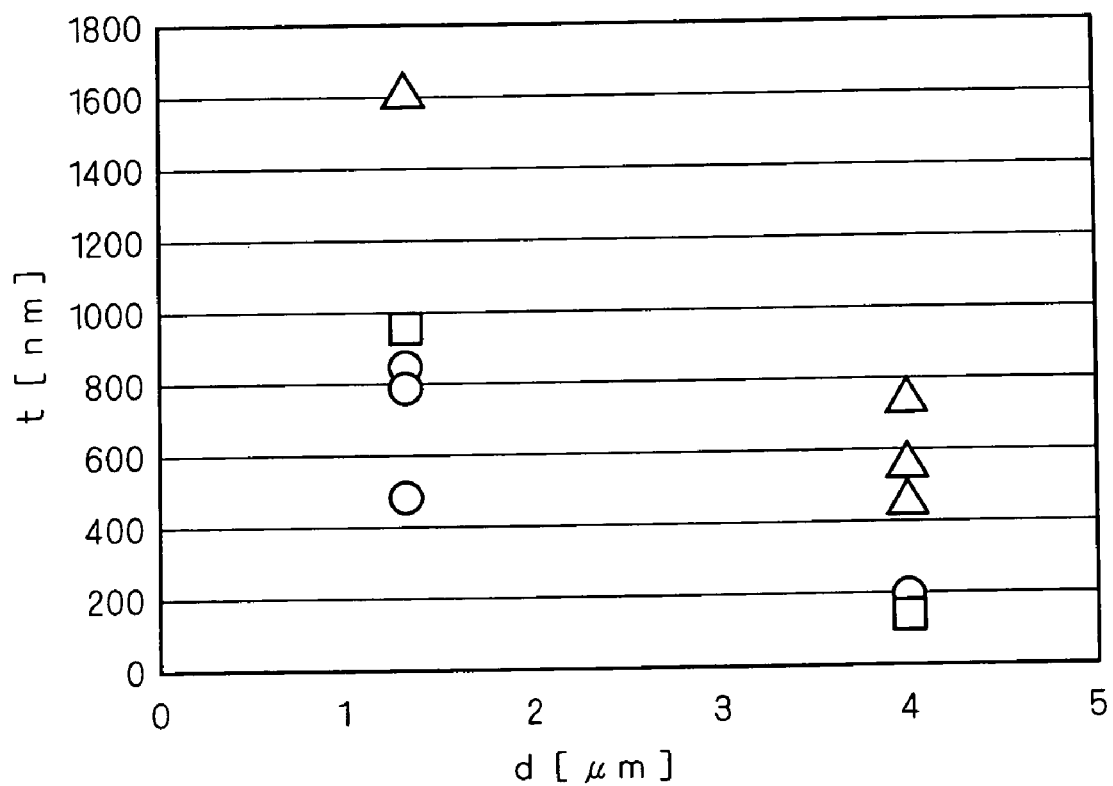
FIG. 38 is a graph showing the fifth preferred embodiment of the invention.

FIG. 38 is a graph showing the relation between the film thickness t of the photoresist 307 at shoulder J and the distance d, where the height h of the fixed electrodes 51, 52, elastic portions 53c, and movable electrodes 53a is set at 3.5 µm. The circles, squares, and triangles respectively show values obtained respectively when the flat portion of the photoresist 307 has film thicknesses of 2.5 µm, 3.0 µm, and 3.5 µm. In general, in flat portions, the photoresist 307 obtained in a single application step exhibits a film thickness of 3.5 µm or less. On the other hand, considering that the later removal of the insulating films 2 and 3 adopts dry-etching, about 500 nm of photoresist 307 is required, except in the vicinity of the dummy body 54. Therefore it can be concluded from FIG. 38 that the distance d is desirably 4 µm or less.

Thus, in this preferred embodiment, setting the distance between the fixed electrodes and the movable electrodes (including the elastic portions) at 4 µm or less is advantageous in that even photoresist 307 having a small thickness can provide good step coverage and that it is not necessary to apply it in separate plural application steps. As in the fourth preferred embodiment, forming the dummy body 54 is desired also in this preferred embodiment, though not shown in FIG. 37.

While the invention has been described in detail, the foregoing description is in all aspects illustrative and not restrictive. It is understood that numerous other modifications and variations can be devised without departing from the scope of the invention.

What is claimed is:

1. A semiconductor device manufacturing method comprising:
   (a) forming an interconnection in a surface of an insulating layer provided on a semiconductor substrate;
   (b) selectively removing said insulating layer to form a first opening that exposes said semiconductor substrate;
   (c) after said selectively removing (b), forming, over said insulating layer, a sacrificial layer having a second opening that exposes a center portion of said interconnection and a third opening that includes said first opening and is larger than said first opening;
   (d) forming a conductive semiconductor all over the structure obtained in said forming (c);
   (e) forming a first mask on said conductive semiconductor;
   (f) etching said conductive semiconductor using said first mask to form a first electrode connected to said interconnection;
   (g) forming a conductive film all over the structure obtained in said etching (f);
   (h) selectively removing said conductive film to form a second electrode in contact with said semiconductor substrate in said first opening; and
   (i) removing said sacrificial layer.

2. The semiconductor device manufacturing method according to claim 1, further comprising, conducted between said selectively removing (b) and said forming (c), (j) forming an insulating film that exposes the center portion of said interconnection and a center portion of said first opening,
   wherein said sacrificial layer exposes edges of said insulating film on said interconnection.

3. The semiconductor device manufacturing method according to claim 1, wherein said forming (e) comprises:

(e-1) forming an oxide film on said conductive semiconductor;

(e-2) forming a photoresist covering an area where said first electrode is to be formed; and (e-3) etching said oxide film using said photoresist as a second mask to form said first mask.

4. The semiconductor device manufacturing method according to claim 1, wherein said interconnection has a surface that is nearly level with the surface of said insulating layer.

5. The semiconductor device manufacturing method according to claim 1, wherein said first electrode functions as a fixed electrode of an acceleration sensor and said second electrode functions as a substrate electrode of said acceleration sensor.

6. A semiconductor device manufacturing method, comprising:

(a) forming an insulating layer on a surface of a semiconductor substrate having a locally projecting raised portion, which is exposed by said insulating layer;

(b) forming an interconnection in a surface of said insulating layer;

(c) forming, over said insulating layer, a sacrificial layer having a first opening that exposes a center portion of said interconnection and a second opening that exposes a center portion of said raised portion;

(d) forming a conductive semiconductor all over the structure obtained in said forming (c);

(e) forming a first mask on said conductive semiconductor;

(f) etching said conductive semiconductor using said first mask to form a first electrode connected to said interconnection;

(g) forming a conductive film all over the structure obtained in said etching (f);

(h) selectively removing said conductive film to form a second electrode in contact with said raised portion; and (i) removing said sacrificial layer.

7. The semiconductor device manufacturing method according to claim 6, wherein said forming (a) comprises (a-1) forming said raised portion on said surface of said semiconductor substrate.

8. The semiconductor device manufacturing method according to claim 6, further comprising, conducted between said forming (b) and said forming (c), (1) forming an insulating film that exposes the center portion of said interconnection and the center portion of said raised portion, wherein said sacrificial layer exposes edges of said insulating film above said interconnection and above said raised portion.

9. The semiconductor device manufacturing method according to claim 6, wherein said forming (e) comprises:

(e-1) forming an oxide film on said conductive semiconductor;

(e-2) forming a photoresist covering an area where said first electrode is to be formed; and (e-3) etching said oxide film using said photoresist as a second mask to form said first mask.

10. The semiconductor device manufacturing method according to claim 6, wherein said interconnection has a surface that is nearly level with the surface of said insulating layer.

11. The semiconductor device manufacturing, method according to claim 6, wherein said first electrode functions as a fixed electrode of an acceleration sensor and said second electrode functions as a substrate electrode of said acceleration sensor.

12. A semiconductor device manufacturing method, comprising:

(a) forming an insulating layer on a semiconductor substrate;

(b) forming, over said insulating layer, a first sacrificial layer having a first opening;

(c) forming a first electrode on said sacrificial layer;

(d) forming a second sacrificial layer all over the structure obtained in said forming (c);

(e) etching back at least said second sacrificial layer;

(f) covering the structure obtained in said etching (e) with a photoresist having a second opening that opens inside said first opening;

(g) etching said second sacrificial layer using said photoresist as a mask;

(h) forming a second electrode in contact with said semiconductor substrate in an area opened in said etching (g); and (i) removing said first sacrificial layer and said second sacrificial layer.

13. The semiconductor device manufacturing method according to claim 12, wherein said etching (e) comprises (e-1) forming an insulating film all over the surface after the etch-back of said second sacrificial layer.

14. The semiconductor device manufacturing method according to claim 12, wherein said forming (h) comprises:

(h-1) etching said insulating layer in the area opened in said etching (g) to expose said semiconductor substrate;

(h-2) forming a conductive film all over the structure obtained in said etching (h-1); and (h-3) selectively removing said conductive film to form said second electrode.

15. The semiconductor device manufacturing method according to claim 12, wherein said first electrode functions as a fixed electrode of an acceleration sensor and said second electrode functions as a substrate electrode of said acceleration sensor.

16. A semiconductor device manufacturing method, comprising:

(a) forming an insulating layer on a semiconductor substrate;

(b) forming, over said insulating layer, a first sacrificial layer having a first opening;

(c) forming, on said sacrificial layer, a first electrode and a dummy body between said first electrode and said first opening;

(d) forming a photoresist on the structure obtained in said forming (c), said photoresist having a second opening that opens inside said first opening;

(e) etching said insulating layer using said photoresist as a mask to expose said semiconductor substrate;

(f) forming a second electrode in contact with said exposed semiconductor substrate; and (g) removing said sacrificial layer.

* * * * *